United States Patent
Hsieh et al.

(10) Patent No.: US 11,955,589 B2
(45) Date of Patent: Apr. 9, 2024

(54) LIGHT-EMITTING DEVICE, MANUFACTURING METHOD THEREOF AND DISPLAY MODULE USING THE SAME

(71) Applicant: EPISTAR CORPORATION, Hsinchu (TW)

(72) Inventors: Min-Hsun Hsieh, Hsinchu (TW); Tzu-Hsiang Wang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 91 days.

(21) Appl. No.: 17/376,515

(22) Filed: Jul. 15, 2021

(65) Prior Publication Data

US 2021/0343918 A1 Nov. 4, 2021

Related U.S. Application Data

(63) Continuation of application No. 16/274,659, filed on Feb. 13, 2019, now Pat. No. 11,094,863.

(30) Foreign Application Priority Data

Feb. 14, 2018 (TW) .................................. 107105393
Jul. 3, 2018 (TW) .................................. 107122868

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 27/156* (2013.01);
(Continued)

(58) Field of Classification Search
CPC ... H01L 33/62; H01L 25/0753; H01L 27/156; H01L 33/38; H01L 33/50; H01L 2933/0066; H01L 33/08
See application file for complete search history.

(56) References Cited

U.S. PATENT DOCUMENTS 8,441,121 B2   5/2013   Sun
10,497,835 B2  12/2019  Jung
(Continued)

FOREIGN PATENT DOCUMENTS

CN    104662118 A   5/2015
CN    204857720 U   12/2015
(Continued)

*Primary Examiner* — S M Sohel Imtiaz
(74) *Attorney, Agent, or Firm* — Patterson + Sheridan, LLP

(57) ABSTRACT

A light-emitting device comprises a carrier, which comprises a plurality of side surfaces, an insulating layer, an upper conductive layer arranged on the insulating layer, a lower conductive layer arranged under the insulating layer, and a plurality of conductive through holes arranged between and connected to the upper conductive layer and the lower conductive layer; a plurality of light-emitting units arranged on and electrically connected to the upper conductive layer; and a transparent unit fully covering the plurality of light-emitting units, and exposing the lower conductive layer, wherein the plurality of conductive through holes are not completely buried within the insulating layer, and each conductive through hole is sandwiched by two adjacent ones of the plurality of side surfaces.

18 Claims, 28 Drawing Sheets

(51) Int. Cl.
*H01L 27/15* (2006.01)
*H01L 33/38* (2010.01)
*H01L 33/50* (2010.01)

(52) U.S. Cl.
CPC ............ *H01L 33/38* (2013.01); *H01L 33/50* (2013.01); *H01L 2933/0066* (2013.01)

(56) References Cited

U.S. PATENT DOCUMENTS

| | | | | |
|---|---|---|---|---|
| 2007/0051966 | A1* | 3/2007 | Higashi | H01L 24/97 257/E33.059 |
| 2011/0299269 | A1* | 12/2011 | Hata | F21V 31/04 156/182 |
| 2014/0246648 | A1* | 9/2014 | Im | H01L 33/382 257/13 |
| 2014/0362565 | A1* | 12/2014 | Yao | F21K 9/235 362/223 |
| 2015/0001463 | A1 | 1/2015 | Choi et al. | |
| 2015/0129919 | A1* | 5/2015 | Liu | H01L 24/19 257/98 |
| 2015/0295154 | A1 | 10/2015 | Tu et al. | |
| 2016/0056134 | A1* | 2/2016 | Hsieh | H01L 25/0753 257/89 |
| 2017/0125640 | A1* | 5/2017 | Kim | H01L 33/145 |
| 2017/0162745 | A1* | 6/2017 | Moriyasu | H01L 33/44 |
| 2017/0254518 | A1 | 9/2017 | Vasylyev | |
| 2017/0330852 | A1* | 11/2017 | Kataoka | H05K 1/181 |
| 2018/0114800 | A1* | 4/2018 | Pan | H01L 27/1218 |
| 2018/0358513 | A1* | 12/2018 | Jung | H01L 33/06 |
| 2019/0067255 | A1* | 2/2019 | Lim | H01L 25/0753 |
| 2019/0115328 | A1* | 4/2019 | Lee | H01L 33/00 |
| 2022/0158064 | A1* | 5/2022 | Bang | H01L 33/64 |

FOREIGN PATENT DOCUMENTS

| | | |
|---|---|---|
| CN | 105280795 A | 1/2016 |
| CN | 105849820 A | 8/2016 |
| CN | 206370442 U | 8/2017 |
| CN | 206451731 U | 8/2017 |
| CN | 107623065 A | 1/2018 |
| JP | 2009105153 A | 5/2009 |
| KR | 20170037565 A | 4/2017 |
| TW | 201234666 A | 8/2012 |
| TW | 201714328 A | 4/2017 |

\* cited by examiner

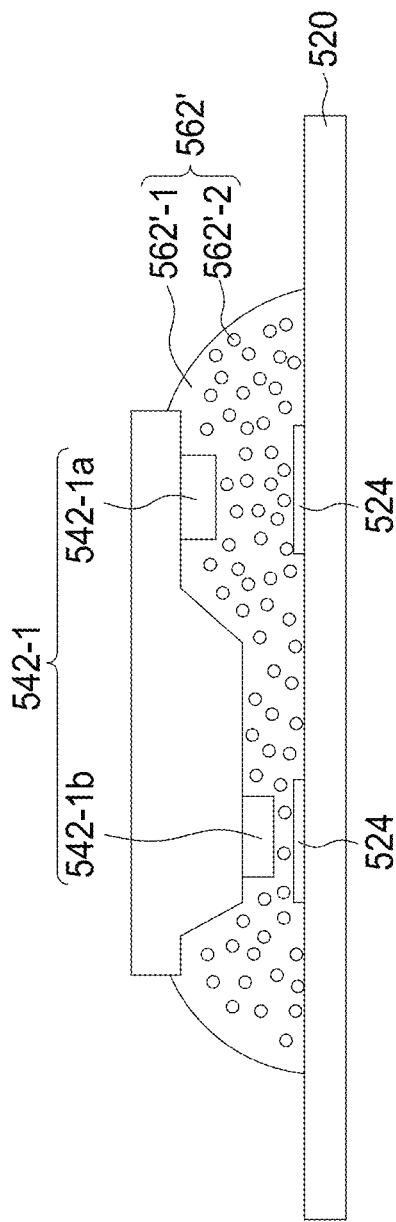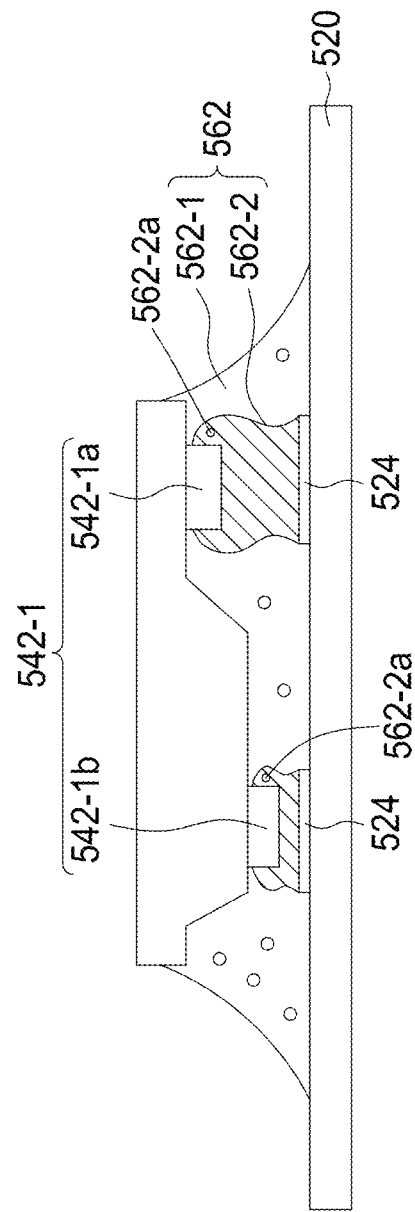

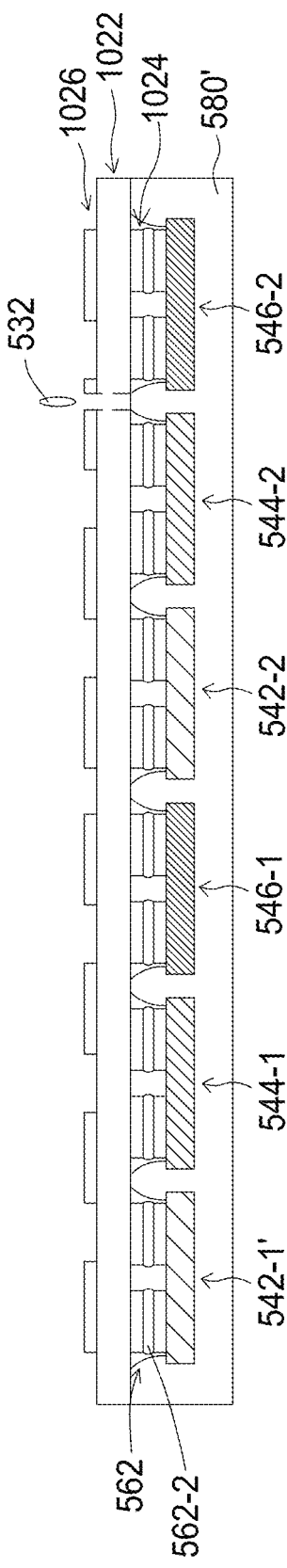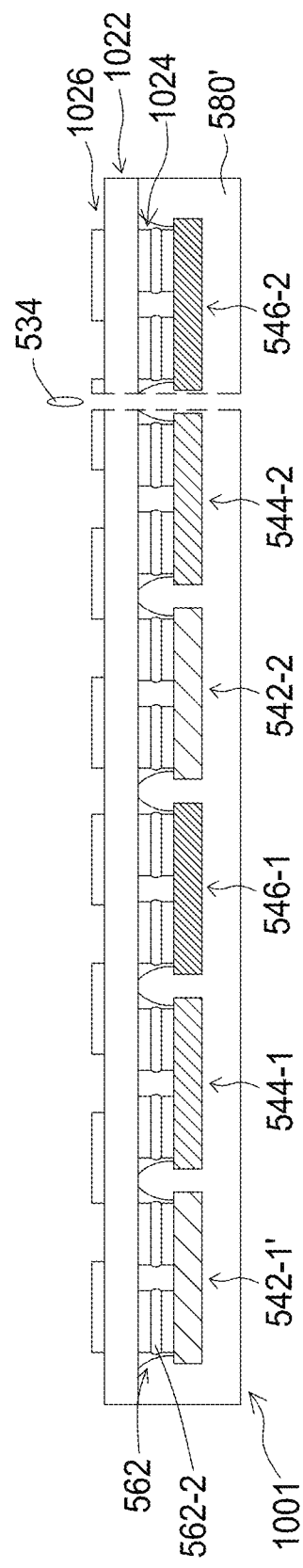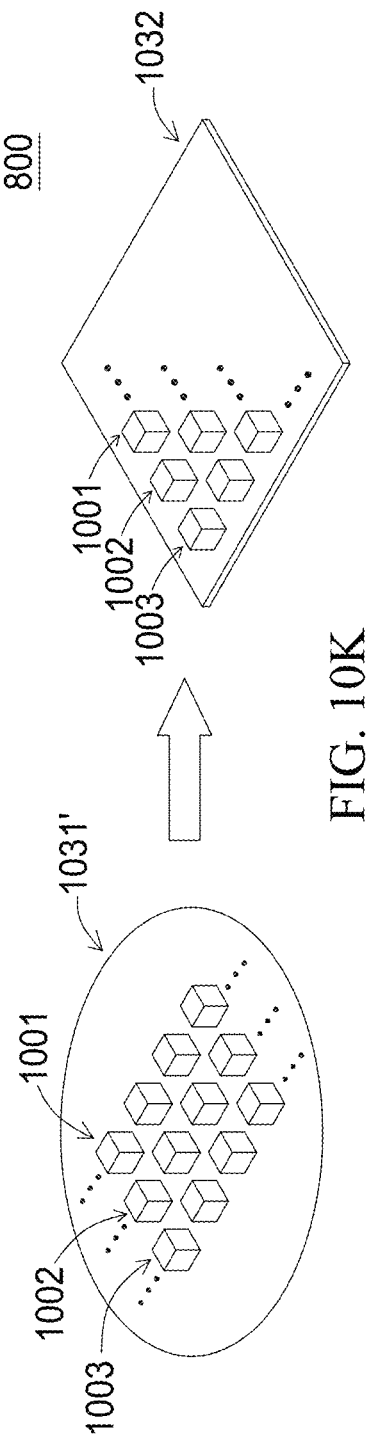

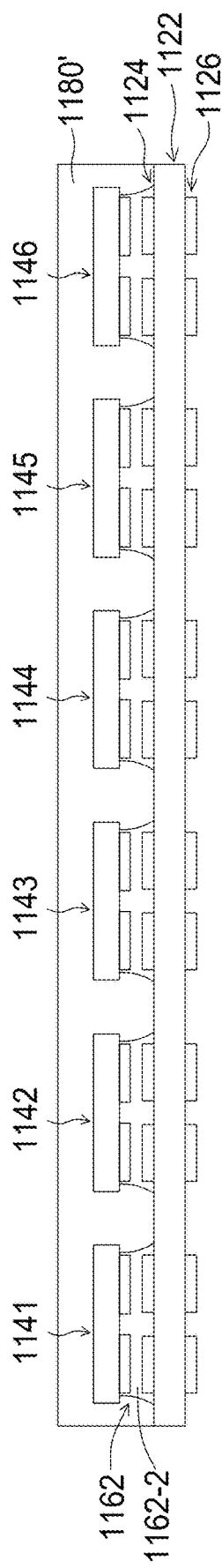
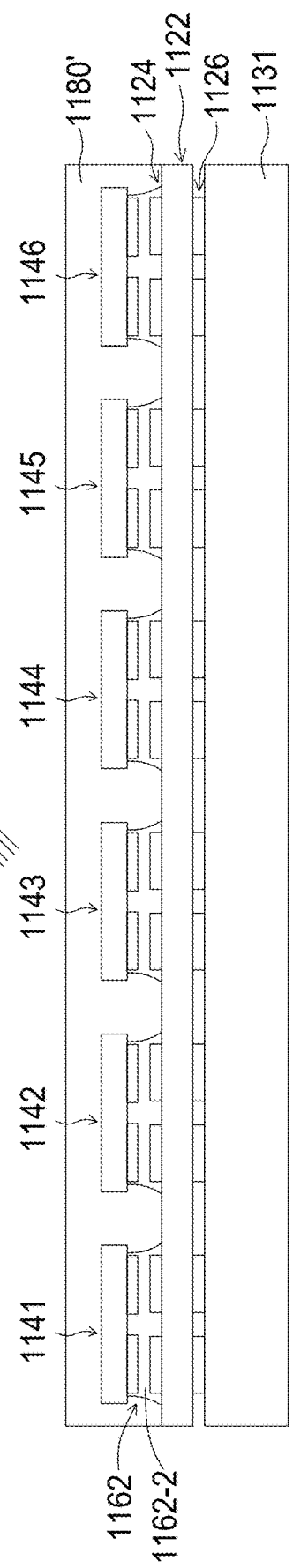
FIG. 11D
FIG. 11E

1200

1200

1400

LIGHT-EMITTING DEVICE, MANUFACTURING METHOD THEREOF AND DISPLAY MODULE USING THE SAME

RELATED APPLICATION DATA

This application is a continuation application of Ser. No. 16/274,659, filed on Feb. 13, 2019, which claims the right of priority of TW Application No. 107122868, filed on Jul. 3, 2018, which claims the right of domestic priority of TW Application No. 107105393, filed on Feb. 14, 2018, the content of which is hereby incorporated by reference in their entirety.

TECHNICAL FIELD

This present application is related to a light-emitting device and a manufacturing method thereof, and especially a light-emitting device, which has a carrier with certain structure and a certain connection, and a manufacturing method thereof.

DESCRIPTION OF BACKGROUND ART

Light-emitting diode (LED) has special properties, such as low power consumption, low heat radiation, long lifetime, high impact resistance, small volume, high responding speed so LED is widely used in applications requiring light-emitting units, such as vehicle, household electric appliance, display, or lighting fixture.

LED is able to emit monochromatic light, so LED is suitable to be a pixel of display like outdoor or indoor display, and one of the trends for display technology development is to increase the resolution of the display. For increasing the resolution of the display, the LED should be miniaturized.

SUMMARY OF THE DISCLOSURE

The application discloses A light-emitting device comprises a carrier, which comprises a plurality of side surfaces, an insulating layer, an upper conductive layer arranged on the insulating layer, a lower conductive layer arranged under the insulating layer, and a plurality of conductive through holes arranged between and connected to the upper conductive layer and the lower conductive layer; a plurality of light-emitting units arranged on and electrically connected to the upper conductive layer; and a transparent unit fully covering the plurality of light-emitting units, and exposing the lower conductive layer, wherein the plurality of conductive through holes are not completely buried within the insulating layer, and each conductive through hole is sandwiched by two adjacent ones of the plurality of side surfaces.

BRIEF DESCRIPTION OF THE DRAWINGS

FIGS. 5A~5J show a process of manufacturing a light-emitting device in accordance with one embodiment of present application.

FIGS. 10A~10K show a manufacturing process of a display module in accordance with one embodiment of present application.

FIGS. 11A~11I show a manufacturing process of a display module in accordance with one embodiment of present application.

DETAILED DESCRIPTION OF PREFERRED EMBODIMENTS

Figure 1A:
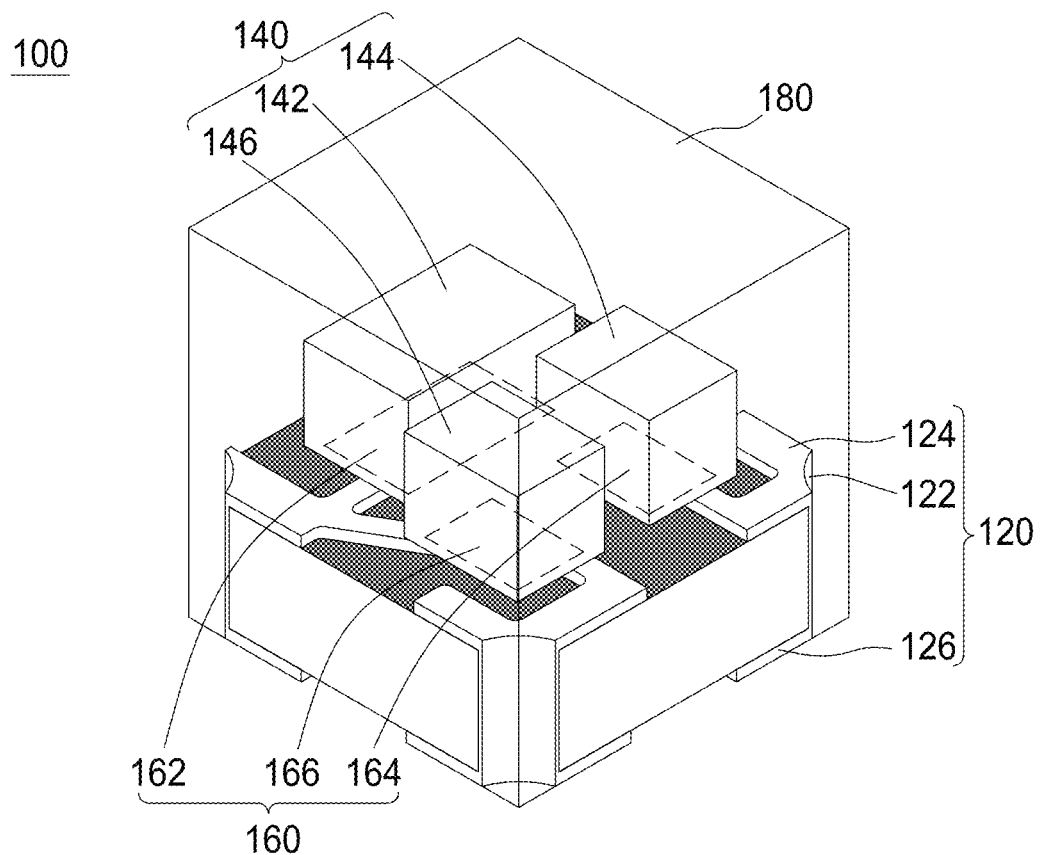
FIG. 1A shows a three-dimensional figure of a light-emitting device in accordance with one embodiment of present application.

The embodiments of the application are illustrated in details, and are plotted in the drawings. The same or the similar parts in the drawings and the specification have the same reference numeral. In the drawings, the shape and thickness of a specific element could be shrunk or enlarged. It should be noted that the element which is not shown in the drawings or described in the following description could be the structure well-known by the person having ordinary skill in the art.

Figure 1B:
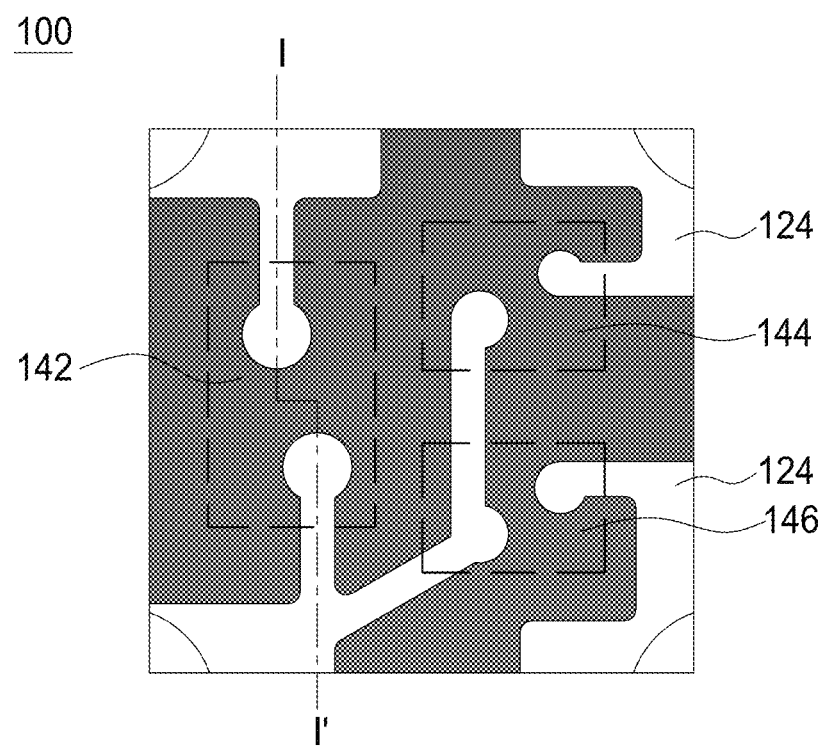
FIG. 1B shows a top view of the light-emitting device disclosed in FIG. 1A.
Figure 1C:
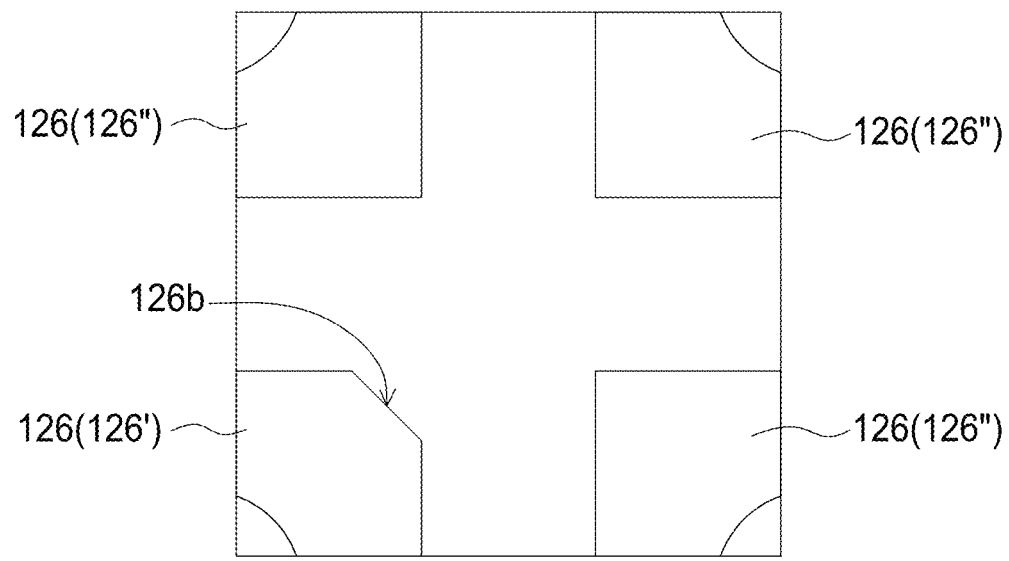
FIG. 1C shows a bottom view of the light-emitting device disclosed in FIG. 1A.

FIG. 1A shows a three-dimensional figure of a light-emitting device 100 in accordance with one embodiment of present application. FIG. 1B shows a top view of the light-emitting device 100 disclosed in FIG. 1A. FIG. 1C shows a bottom view of the light-emitting device 100 disclosed in FIG. 1A. The light-emitting device 100 includes a carrier 120, a light-emitting element 140, a connecting structure 160, and a transparent unit 180. In one embodiment, the light-emitting element 140 includes a first light-emitting unit 142, a second light-emitting unit 144, and a third light-emitting unit 146. In one embodiment, the light-emitting element 140 is formed on the carrier 120, the connecting structure 160 is formed between the carrier 120 and the light-emitting element 140, and the transparent unit 180 covers the light-emitting element 140 and the connecting structure 160.

In one embodiment, the carrier 120 includes an insulating layer 122, an upper conductive layer 124, and a lower conductive layer 126. The upper conductive layer 124 electrically connects the light-emitting element 140 and the lower conductive layer 126. The lower conductive layer 126 electrically connects the external power supply. In one embodiment, the upper conductive layer 124 electrically connects the lower conductive layer 126 through the conductive via (not shown). The conductive via penetrates the insulating layer 122, and can be formed in the periphery or interior of the insulating layer 122. In one embodiment, the upper conductive layer 124 is formed upon the insulating layer 122 and of patterned structure, and the lower conductive layer 126 is formed under the insulating layer 122 and of patterned structure. Referring to FIG. 1C, in one embodiment, the first, second, and third light-emitting units 142, 144, 146 have one common electrode, so the lower conductive layer 126 has four electrode pads. Specifically, in the embodiment, the common electrode means an end point physically and electrically connecting multiple electrodes of same polarity of multiple light-emitting units. In one embodiment, the first, second, and third light-emitting units 142, 144, 146 are light-emitting diodes, and the p-type semiconductors layers (not shown) thereof share the same electrode. In another embodiment, the n-type semiconductor layers (not shown) of the first, second, and third light-emitting units 142, 144, 146 share the same electrode. In one embodiment, a shape of one electrode pad 126' of the lower conductive layer 126 is different from the shapes of the other three electrode pads 126" for identification purpose. In the embodiment, in the lower conductive layer 126, one corner of the electrode pad 126' of the common electrode has a bevel surface 126b as shown in FIG. 1C. Namely, the shape of the electrode pad 126' is a pentagon and different from the other three electrode pads 126", which are quadrangles. The four electrode pads 126', 126" are located in the four corners respectively and electrically connects to four external electrodes. In another embodiment, there are six electrodes for the first, second, and third light-emitting units 142, 144, 146 to electrically connect to external power supply independently so the lower conductive layer 126 has six electrode pads.

The material of the insulating layer 122 can be epoxy resin, BT (Bismaleimide Triazine) resin, polyimide resin, composite of epoxy resin and fiberglass, or composite of BT resin and fiberglass. The material of the upper conductive layer 124 and the lower conductive layer 126 can be metal, such as Cu, Sn, Al, Ag or Au. In one embodiment, if the light-emitting device 100 is a pixel of a display device, a light-absorbing layer (not shown), such as black coating layer, can be formed on the surface of the insulating layer 122 to enhance contrast of the display device.

Figure 1D:
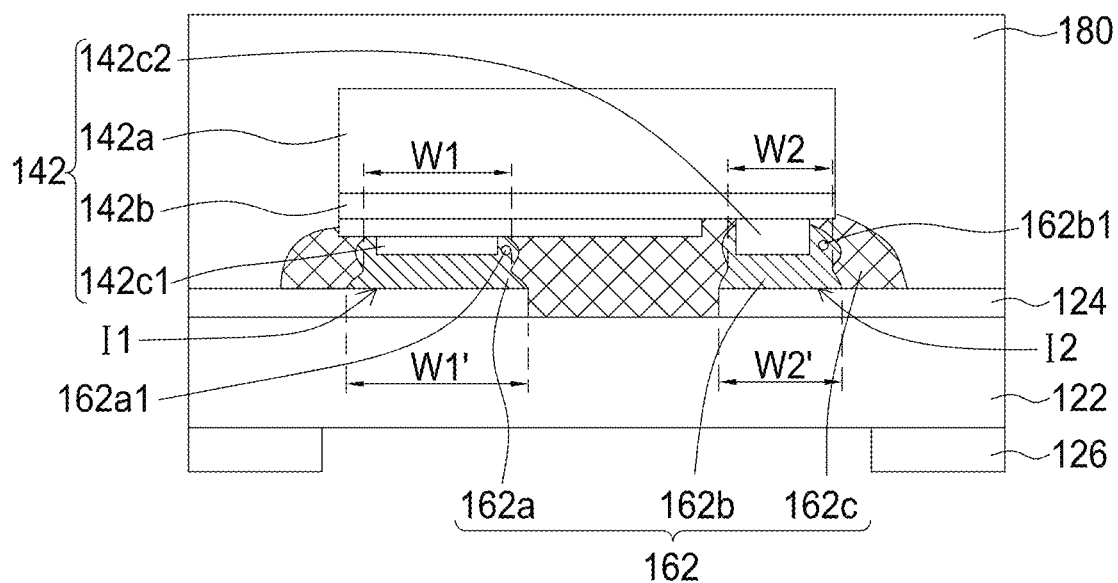
FIG. 1D shows a cross-section of the light-emitting device disclosed in FIG. 1A.

Referring to FIG. 1A, in the embodiment, the number of the light-emitting unit is three, but it is not a limitation. In other embodiment, the number of the light-emitting unit can be one, two, four, or five. In one embodiment, the first light-emitting unit 142, the second light-emitting unit 144, and the third light-emitting unit 146 can be LED (light-emitting diode) dies for emitting different dominant wavelengths (Wd) or different colors. In one embodiment, the first light-emitting unit 142 is a red LED die, which can be driven by an electrical current provided by power supply to emit a first light with a dominant wavelength or peak wavelength between 600 nm~660 nm. FIG. 1D shows a cross-sectional view along I-I' in FIG. 1B. In one embodiment, the first light-emitting unit 142 includes a substrate 142a, a light-emitting layer 142b, and contacting electrodes 142c1, 142c2, wherein the light-emitting layer 142b has one side facing the substrate 142a and another side facing the contacting electrodes 142c1, 142c2. The substrate 142a can carry or support the light-emitting layer 142b. Besides, the substrate 142a is distant from a surface of the light-emitting layer 142b, which is an upper surface of the first light-emitting unit 142 and is also a light extraction surface thereof. In one embodiment, the substrate 142a is a transparent ceramic substrate, such as Aluminum Oxide substrate and bound with the light-emitting layer 142b through a bonding layer (not shown).

In one embodiment, the second light-emitting unit 144 is a green LED die, which can emit a second light with a dominant wavelength or peak wavelength between 510 nm~560 nm. The composition of the second light-emitting unit 144 is similar to that of the first light-emitting unit 142. The second light-emitting unit 144 includes a substrate, a light-emitting layer, and contacting electrodes, wherein the composition of the light-emitting layer of the second light-emitting unit 144 is different from that of the first light-emitting unit 142. Besides, in one embodiment, the substrate of the second light-emitting unit 144 is a growth substrate, such as sapphire, for epitaxially growing the light-emitting layer. The structure of the third light-emitting unit 146 is similar to that of the first light-emitting unit 144, wherein the composition of the light-emitting layer of the third light-emitting unit 146 is different from that of the second light-emitting unit 144.

In another embodiment, the first light-emitting unit 142 includes a LED die covered by a wavelength conversion material, wherein the LED die is able to emit blue light or UV light, with a wavelength shorter than that of red light, and the wavelength conversion material is able to convert blue light or UV light into red light. The second light-emitting unit 144 includes a LED die covered by a wavelength conversion material, wherein the LED die is able to emit blue light or UV light, with a wavelength shorter than that of green light, and the wavelength conversion material is able to convert blue light or UV light into green light. The third light-emitting unit 146 includes a LED die covered by a wavelength conversion material, wherein the LED die is able to emit UV light, with a wavelength shorter than that of blue light, and the wavelength conversion material is able to convert blue light or UV light into blue light.

Referring to FIG. 1B, in one embodiment, the first light-emitting unit 142, the second light-emitting unit 144, and the third light-emitting unit 146 are arranged as a triangle and respectively located on the three vertices. In another embodiment, the first light-emitting unit 142, the second light-emitting unit 144, and the third light-emitting unit 146 are arranged as a straight line.

Referring to FIG. 1A, in one embodiment, the connecting structure 160 includes a first block 162, a second block 164, and a third block 166. The first block 162 of the connecting structure 160 is able to electrically and physically connect the carrier 120 and the first light-emitting unit 142. Furthermore, referring to FIG. 1D, the first block 162 includes a first electrical connecting portion 162*a*, a second electrical connecting portion 162*b*, and a first protection portion 162*c*. In one embodiment, the first electrical connecting portion 162*a* electrical connects the upper conductive layer 124 and the contacting electrodes 142*c*1, the second electrical connecting portion 162*b* electrically connects the upper conductive layer 124 and the contacting electrodes 142*c*2, and the first protection portion 162*c* surrounds the first electrical connecting portion 162*a* and the second electrical connecting portion 162*b*. In one embodiment, the contours of the first electrical connecting portion 162*a* and the second electrical connecting portion 162*b* can be flat or bumpy. In one embodiment, the first electrical connecting portion 162*a* and/or the second electrical connecting portion 162*b* have neck shape. In other words, the first electrical connecting portion 162*a* has a width W1 between the contacting electrode 142*c*1 and the upper conductive layer 124 smaller than a width W1' of an interface I1 between the first electrical connecting portion 162*a* and the upper conductive layer 124, or the second electrical connecting portion 162*b* has a width W2 between the contacting electrode 142*c*2 and the upper conductive layer 124 smaller than a width W2' of an interface I2 between the second electrical connecting portion 162*b* and the upper conductive layer 124. In one embodiment, the first electrical connecting portion 162*a* and the second electrically connecting portion 162*b* are mainly formed of electrically conductive material mixing with resin. In one embodiment, the first electrical connecting portion 162*a* and the second electrically connecting portion 162*b* includes cavities 162*a*1, 162*b*1. In another embodiment, the first electrical connecting portion 162*a* and the second electrical connecting portion 162*b* are completely made of electrically conductive material.

In one embodiment, the first protection portion 162*c* is located between the first electrical connecting portion 162*a* and the second electrical connecting portion 162*b*, surrounds and covers the first electrical connecting portion 162*a* and the second electrical connecting portion 162*b*, and connects the carrier 120 and a surface of the first light-emitting unit 142. The first protection portion 162*c* not only protects the first electrical connecting portion 162*a* and the second electrical connecting portion 162*b*, but also prevents the electrically conductive material from being oxidized by the moisture of the environment and prevents the first electrical connecting portion 162*a* and the second electrical connecting portion 162*b* which are softened or melted in high temperature from being short-circuited. Besides, the first protection portion 162*c* is able to enhance bonding strength between the carrier 120 and a surface of the first light-emitting unit 142. In one embodiment, the first protection portion 162*c* is mainly made of resin and may include little electrically conductive material. It is worth noted that the electrically conductive material is not presented continuously between the first electrical connecting portion 162*a* and the second electrical connecting portion 162*b*. In another embodiment, the first protection portion 162*c* is made of resin without electrically conductive material.

The electrically conductive materials of the first electrical connecting portion 162*a*, the second electrical connecting portion 162*b* and the first protection portion 162*c* can be the same or different, wherein the electrically conductive material includes Au, Ag, Cu or alloy of Sn. In one embodiment, the electrically conductive material includes metal with low melting point or an alloy with low liquidus melting point. In one embodiment, the temperature of the low melting point of the metal or the low liquidus melting point of the alloy is lower 210° C. In other embodiment, the temperature of the low melting point of the metal or the low liquidus melting point of the alloy is lower 170° C., wherein the alloy with low liquidus melting point includes InSn alloy or BiSn alloy.

The resin contained in the first electrical connecting portion 162*a*, the second electrical connecting portion 162*b*, and the first protection portion 162*c* can be the same or different, wherein the resin may be thermosetting resin. In one embodiment, the resin may be thermosetting epoxy. In one embodiment, the resin has a glass transition temperature (Tg), wherein Tg is larger than 50° C. In the other embodiment, the resin has a glass transition temperature (Tg) larger than 120° C. In one embodiment, the difference of the glass transition temperature (Tg) between the first protection portion 162*c* and the electrically conductive materials of the first electrical connecting portion 162*a* and/or the second electrical connecting portion 162*b* is smaller than 50° C. In one embodiment, a weight ratio of the electrically conductive material to the first block 162 is between 40% and 80%. In another embodiment, the weight ratio of the electrically conductive material to the first block 162 is between 30% and 70%.

Referring to FIG. 1A, in one embodiment, the second block 164 of the connecting structure 160 is able to electrically and physically connect the carrier 120 and the second light-emitting unit 144. Similarly, in one embodiment, the third block 166 of the connecting structure 160 is able to electrically and physically connect the carrier 120 and the third light-emitting unit 146. The specific structure, function and material of the second block 164 and the third block 166 are the same as or similar to the first block 162, which can be referred to FIG. 1D and the corresponding paragraphs.

Referring to FIG. 1A, in one embodiment, the transparent unit 180 covers the light-emitting element 140, the connecting structure 160, and the upper conductive layer 124. In one embodiment, the transparent unit 180 directly contacts the first light-emitting unit 142, the second light-emitting unit 144, the third light-emitting unit 146, the first block 162, the second block 164 and the third block 166 of the connecting structure 160, and the upper conductive layer 124. In one embodiment, a side wall of the transparent unit 180 and a side wall of the carrier 120 are coplanar. In another embodiment, the side wall of the transparent unit 180 and the side wall of the carrier 120 are not coplanar. A surface (not shown) is between the side wall of the transparent unit 180 and the side wall of the carrier 120, and the surface is not parallel to the side wall of the transparent unit 180 and the side wall of the carrier 120, wherein the surface may be a lower surface of the transparent unit 180 or the upper surface of the carrier 120. The transparent unit 180 is able to protect the light-emitting element 140, the connecting structure 160, and the upper conductive layer 124. Besides, a light emitted from the light-emitting element 140 is able to penetrate the transparent unit 180, so one surface of the transparent unit 180 can be as a light extraction surface of the light-emitting device 100. In one embodiment, the penetration rate of the transparent unit 180 for light with wavelength between 440 nm~470 nm, 510 nm~540 nm, and 610 nm~640 nm is larger than 80%. In one embodiment, the refractive index of the transparent unit 180 is between 1.3~2.0. In another embodiment, the refractive index of the transparent unit 180 is between 1.35~1.70. Furthermore, the transparent unit 180 is able to prevent the upper conductive layer 124 from being oxidized by moisture of the environment.

The material of the transparent unit 180 may be resin, ceramic, glass or the combination thereof. In one embodiment, the material of the transparent unit 180 is heat curing resin, wherein the heat curing resin may be epoxy or silicone resin. In one embodiment, the material of the transparent unit 180 is silicone resin, wherein the composition of silicone resin is able to be adjusted by the requirement of the physical and optical characteristics. In one embodiment, the transparent unit 180 is made of silicone resin having aliphatic hydrocarbon group, such as methyl cyclosiloxane compound, with better extensibility for bearing thermal stress from the light-emitting element 140. In the other embodiment, the transparent unit 180 is made of silicone resin having aromatic hydrocarbon group, such as phenyl methicone compound, with larger refractive index for improving light extraction percentage of the light-emitting element 140. The smaller difference of the refractive indices of the materials between the light-emitting element 140 and the light extraction surface thereof, the larger the light angle is, and the light extraction percentage can be improved. In one embodiment, the material of the light extraction surface of the light-emitting element 140 is sapphire, of which the refractive index is about 1.77, and the material of the transparent unit 180 is silicone resin having aromatic hydrocarbon group, of which the refractive index is larger than 1.9.

Figure 2A:
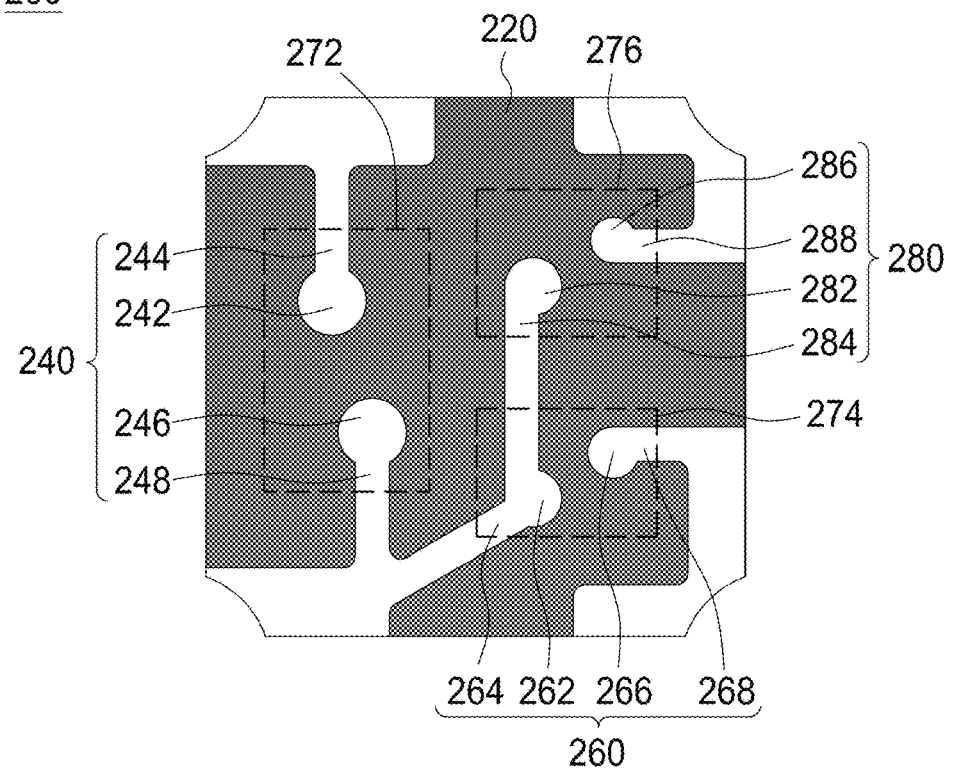
FIG. 2A shows a top view of a carrier of a light-emitting device in accordance with one embodiment of present application.
Figure 2B:
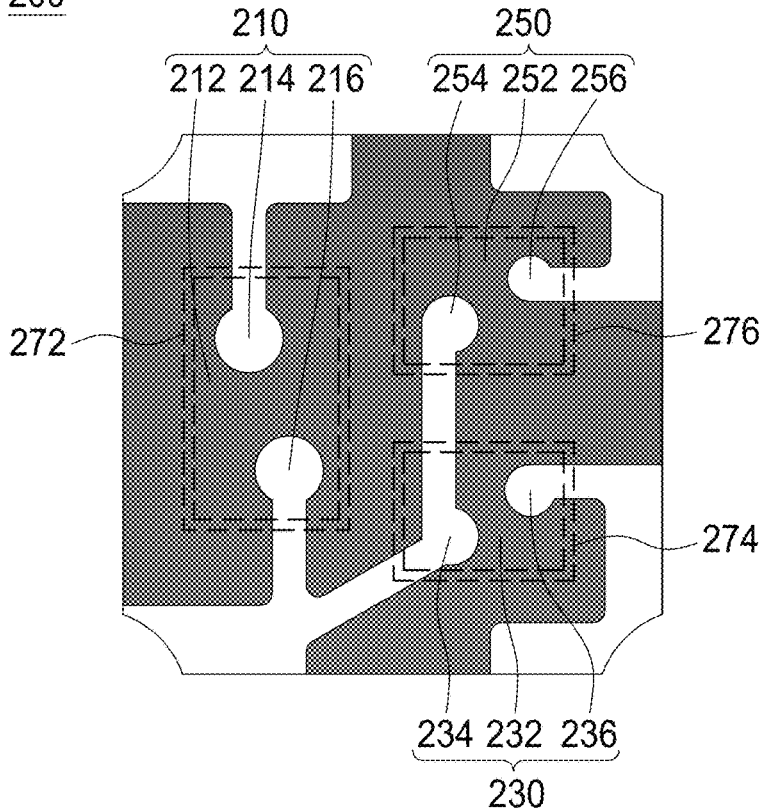
FIG. 2B shows a top view of a carrier and a connecting structure of a light-emitting device in accordance with one embodiment of present application.
Figure 2C:
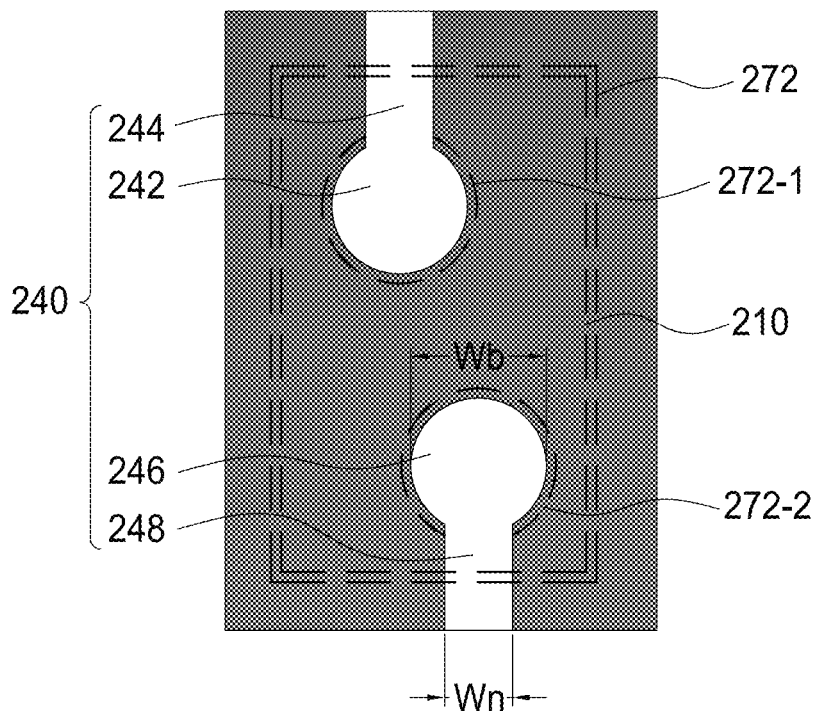
FIG. 2C shows an enlarged diagram of a first region and a first contacting region corresponding to a first light-emitting unit disclosed in FIGS. 2A and 2B.

FIG. 2A shows a top view of a carrier 220 of a light-emitting device 200 in accordance with one embodiment of present application. FIG. 2B shows a top view of a carrier and a connecting structure of the light-emitting device 200 in accordance with one embodiment of present application. FIG. 2C shows an enlarged diagram of a first region 210 and a first contacting region 240 corresponding to a first light-emitting unit 272 disclosed in FIGS. 2A and 2B. In one embodiment, FIGS. 2A~2C and FIGS. 1A~1D show the same embodiment, so FIGS. 2A~2C can be interpreted with FIGS. 1A~1D. FIGS. 2A~2C and FIGS. 1A~1D are able to show different embodiments. In one embodiment, the carrier 220 includes an upper conductive layer, wherein the upper conductive layer includes a first connecting region 240, a second connecting region 260, and a third connecting region 280. In one embodiment, the first connecting region 240 is corresponding to the first light-emitting unit 272. The second connecting region 260 is corresponding to a second light-emitting unit 274. The third connecting region 280 is corresponding to a third light-emitting unit 276. Taking the first light-emitting unit 272 and the corresponding first connecting region 240 as an example, in one embodiment, the first connecting region 240 includes a first connecting portion 242, a first necking portion 244, a second connecting portion 246 and a second necking portion 248. And, referring to FIG. 2C, the first necking portion 244 can be extended from the first connecting portion 242 or connect the first connecting portion 242 to each other. The first connecting portion 242 can be a main electrical connection for a contacting electrode 272-1 of the first light-emitting unit 272. The first necking portion 244 can connect to a portion of the upper conductive layer to be a bridge of outside electrical connection. In one embodiment, the first connecting portion 242 has an area same as or be similar to the area of the contacting electrode 272-1 of the first light-emitting unit 272. In one embodiment, an area ratio of the first connecting portion 242 to the contacting electrode 272-1 of the first light-emitting unit 272 is between 0.8 and 12. Besides, a width Wb of the first connecting portion 242 is larger than a width Wn of the first necking portion 244. In one embodiment, an ratio of the width Wn of the first necking portion 244 to the width Wb of the first connecting portion 242 is smaller than 0.6. Similarly, an area ratio of the second connecting portion 246 to the other contacting electrode 272-2 of the first light-emitting unit 272 is between 0.8 and 12. A ratio of the width Wn of the second necking portion 248 to the width Wb of the first connecting portion 246 is smaller than 0.6. The width Wb and the width Wn respectively mean the largest widths of the connecting portion and the necking portion. For example, as the shape of the connecting portion is a circle, the width Wb of the connecting portion is the diameter of the circle. In one embodiment, the smallest distance between the first connecting portion 242 and the second connecting portion 246 is smaller than 100 μm. In another embodiment, the smallest distance between the first connecting portion 242 and the second connecting portion 246 is smaller than 50 μm.

Referring to FIG. 2B, in one embodiment, the connecting structure includes the first region 210, a second region 230 and a third region 250. In one embodiment, as shown in FIG. 2A, the first contacting region 240 connects the first light-emitting unit 272 through the first region 210 of the connecting structure. A first electrical joint portion 214 of the first region 210 is formed on the first connecting portion 242 and electrically connects one electrode the first light-emitting unit 272, and a second electrical joint portion 216 is formed on the second connecting portion 246 and electrically connects to another electrode of the first light-emitting unit 272. A first protection portion 212 covers the first electrical joint portion 214 and the second electrical joint portion 216. Besides, as shown in FIG. 2A, in one embodiment, the first connecting portion 242 is approximately located in a region surrounded by first protection portion 212. In one embodiment, the area which the first connecting portion 242 covers is larger than or similar to the area of the first light-emitting unit 272.

As shown in FIGS. 2A and 2B, the second light-emitting unit 274 is corresponding to the second region 230 and the second connecting region 260. The structures and functions of a second protection portion 232, a third electrical joint portion 234 and a fourth electrical joint portion 236 of the second region 230 can be the same or similar to those of the first protection portion 212, the first electrical joint portion 214 and the second electrical joint portion 216. The structures and functions of a third connecting portion 262, a third necking portion 264, a fourth connecting portion 266 and a fourth necking portion 248 of the second connecting region 260 can be the same or similar to those of the first connecting portion 242, the first necking portion 244, the second connecting portion 246 and the second necking portion 248. Similarly, the third light-emitting unit 276 is corresponding to the third region 250 and the third connecting region 280. The structures and functions of a third protection portion 252, a fifth electrical joint portion 254 and an sixth electrical joint portion 256 of the third region 250 can be the same or similar to those of the first protection portion 212, the first electrical joint portion 214 and the second electrical joint portion 216. The structures and functions of a fifth connecting portion 282, a fifth necking portion 284, an sixth connecting portion 286 and an sixth necking portion 288 of the third connecting region 280 can be the same or similar to those of the first connecting portion 242, the first necking portion 244, the second connecting portion 246 and the second necking portion 248.

Figure 3A:
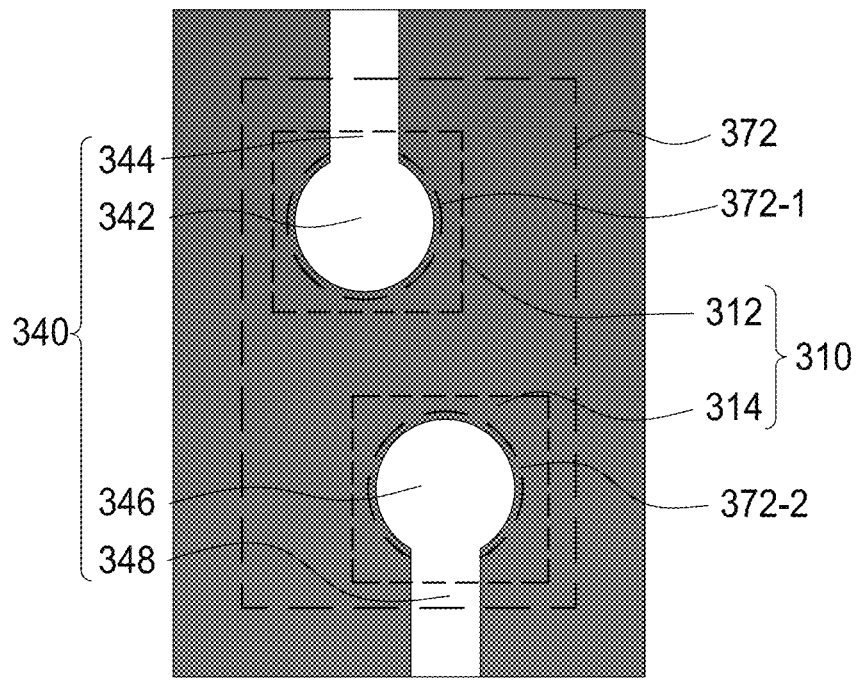
FIG. 3A shows a top view of a first region and a first contacting region corresponding to a first light-emitting unit in accordance with one embodiment of present application.
Figure 3B:
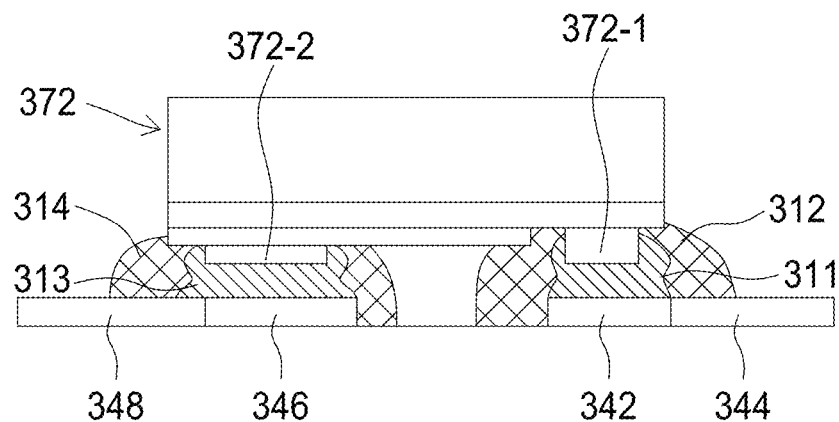
FIG. 3B shows a cross-sectional view of the first light-emitting unit connected to the first contacting region disclosed FIG. 3A.

FIG. 3A shows a top view of a first region 310 and a first contacting region 340 corresponding to a first light-emitting unit 372 in accordance with one embodiment of present application. FIG. 3B shows a cross-sectional view of the first light-emitting unit 372 connected to the first contacting region 340 disclosed in FIG. 3A. Referring to FIGS. 3A and 3B, what differs FIG. 3A from FIG. 2A is in the first region 310 including two protection portions 312, 314. In one embodiment, a contacting electrode 372-1, a first connecting portion 342 of the first contacting region 340 and a first electrical connecting portion 311 are covered by the protection portions 312. A portion of a first necking portion 344 is covered by the protection portions 312. Besides, a contacting electrode 372-2, a second connecting portion 346 and a second electrical connecting portion 313 are covered by the protection portions 314. Besides, a portion of a second necking portion 348 is covered by the protection portions 314.

Figure 4:
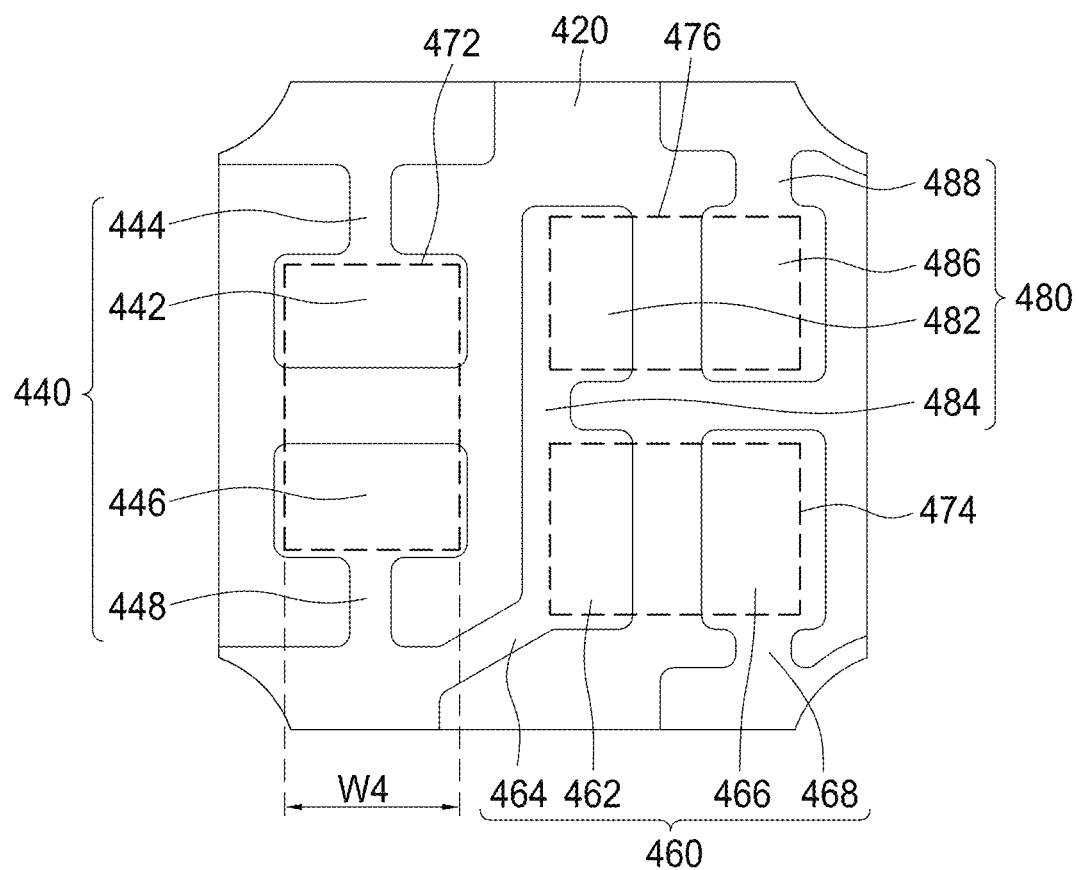
FIG. 4 shows a top view of a carrier of a light-emitting device in accordance with one embodiment of present application.

FIG. 4 shows a top view of a carrier 420 of a light-emitting device 400 in accordance with one embodiment of present application. In one embodiment, the carrier 420 includes an upper conductive layer, wherein the upper conductive layer includes a first connecting region 440, a second connecting region 460 and a third connecting region 480. Taking the first connecting region 440 as an example, the difference between the first connecting region 440 in FIG. 4 and the first contacting region 240 in FIG. 2A is that the width or area of a first connecting portion 442 is larger than those of a corresponding electrode (not shown) of a first light-emitting unit 472. In one embodiment, the width of the first connecting portion 442 is larger than the width W4 of the first light-emitting unit 472, and a width a first necking portion 444 is smaller than the width of the first connecting portion 442. Similarly, a width of a second connecting portion 446 is larger the width W4 of the first light-emitting unit 472, and a width of a second necking portion 448 is smaller than the width of a second connecting portion 446. In another embodiment, the width of the first connecting portion 442 is equal to or smaller than the width W4 of the first light-emitting unit 472. Besides, a second light-emitting unit 474 is corresponding to the second connecting region 460. The structures and functions of a third connecting portion 462, a third necking portion 464, a fourth connecting portion 466, and a fourth necking portion 468 of the second connecting region 460 can be the same or similar to those of the first connecting portion 442, the first necking portion 444, the second connecting portion 446 and the second necking portion 448. Furthermore, the third light-emitting unit 476 is corresponding to the third connecting region 480. The structures and functions of a fifth connecting portion 482, a fifth necking portion 484, an sixth connecting portion 486 and a sixth necking portion 488 of the third connecting region 480 can be the same or similar to those of the first connecting portion 442, the first necking portion 444, the second connecting portion 446 and the second necking portion 448. When the area of the connecting portion of the conductive layer is increased, the difference in height positions of and the tilting of the light-emitting units due to the different volumes thereof can be improved. In detail, the larger the area of the connecting portion of the conductive layer, the flatter the connecting portion is on the connecting portion for connecting the electrode of the light-emitting unit in each region. Thus, even though the volumes of the connecting portions are different, the difference in height positions of the light-emitting units is not too large.

Figure 5A:
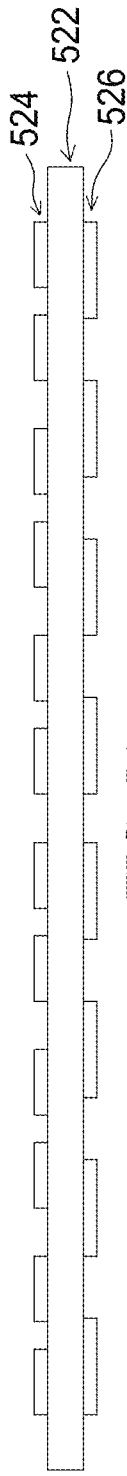

FIGS. 5A~5J show a manufacturing process of a light-emitting device 100 in accordance with one embodiment of present application. Referring to FIG. 5A, a carrier is provided, wherein the carrier includes an insulating layer 522, an upper conductive layer 524, and a lower conductive layer 526. The upper conductive layer 524 and the lower conductive layer 526 respectively have a plurality of connecting points, wherein the plurality of connecting points is able to electrically connect with a plurality of light-emitting elements. In one embodiment, each of the plurality of light-emitting elements includes three light-emitting units, wherein each of the three light-emitting units needs two electrodes corresponding to the connecting points of the upper conductive layer 524 or the lower conductive layer 526. Thus, the upper conductive layer 524 includes 3*2*N connecting points, wherein N can be an integral larger than 1. The three light-emitting units have a common electrode, so the lower conductive layer 526 includes 4*N connecting points.

Figure 5B:
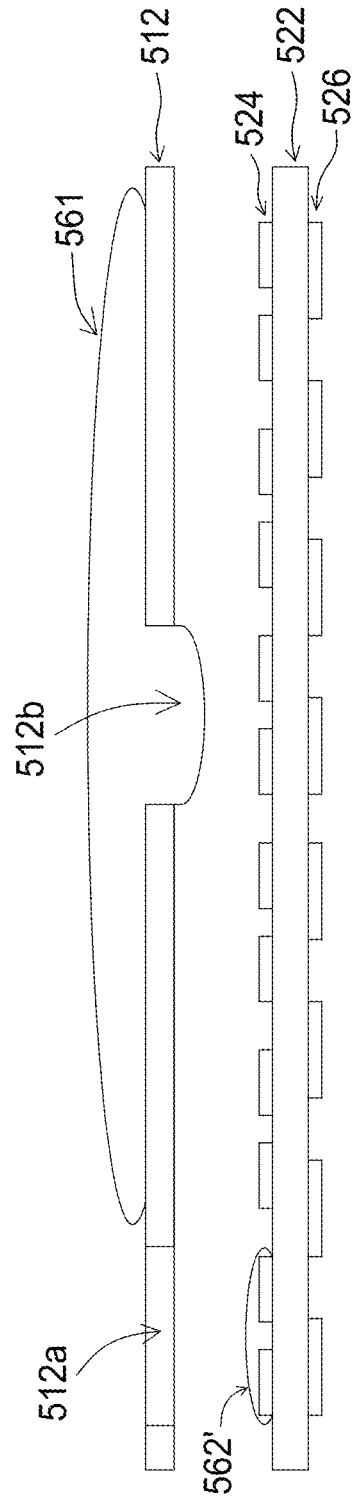
Figure 5C:
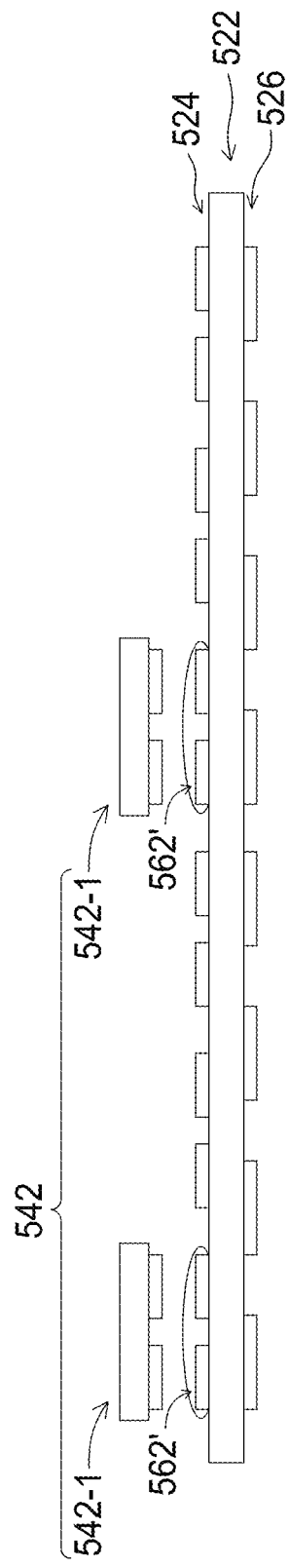

Referring to FIG. 5B, glue 561 with electrically conductive particles (not shown) is formed on the upper conductive layer 524 through a patterned jig 512 to form unsolidified blocks 562'. The patterned jig 512 can be a stencil or a printing plate. In one embodiment, the positions where the unsolidified blocks 562' are formed on are corresponding to the positions which a group of the light-emitting units electrically connects to, and are regions which two electrodes of a light-emitting unit are corresponding to. In another embodiment, each of the positions of the unsolidified blocks 562' is corresponding to the position which each of the electrodes of each light-emitting unit of one group of the light-emitting units electrically connects to, wherein the group of the light-emitting units means the light-emitting units which emit light with the same peak wavelength (Wp) or the same color. For example, all of the light-emitting units in a group emit red light, all of the light-emitting units in a group emit blue light, or all of the light-emitting units in a group emit green light. Referring to FIG. 5C, a first group 542 of light-emitting units is connected with the unsolidified blocks 562' and formed on the upper conductive layer 524. In one embodiment, referring to FIGS. 5C and 5D, the light-emitting units 542-1, 542-2 of the first group 542 are formed on the upper conductive layer 524 one by one. To be more specific, the light-emitting unit 542-1 is firstly formed on the upper conductive layer 524 and another light-emitting unit 542-2 is formed subsequently. Alternatively, the light-emitting units 542-1, 542-2 can be formed on the upper conductive layer 524 at the same time.

Figure 5D:
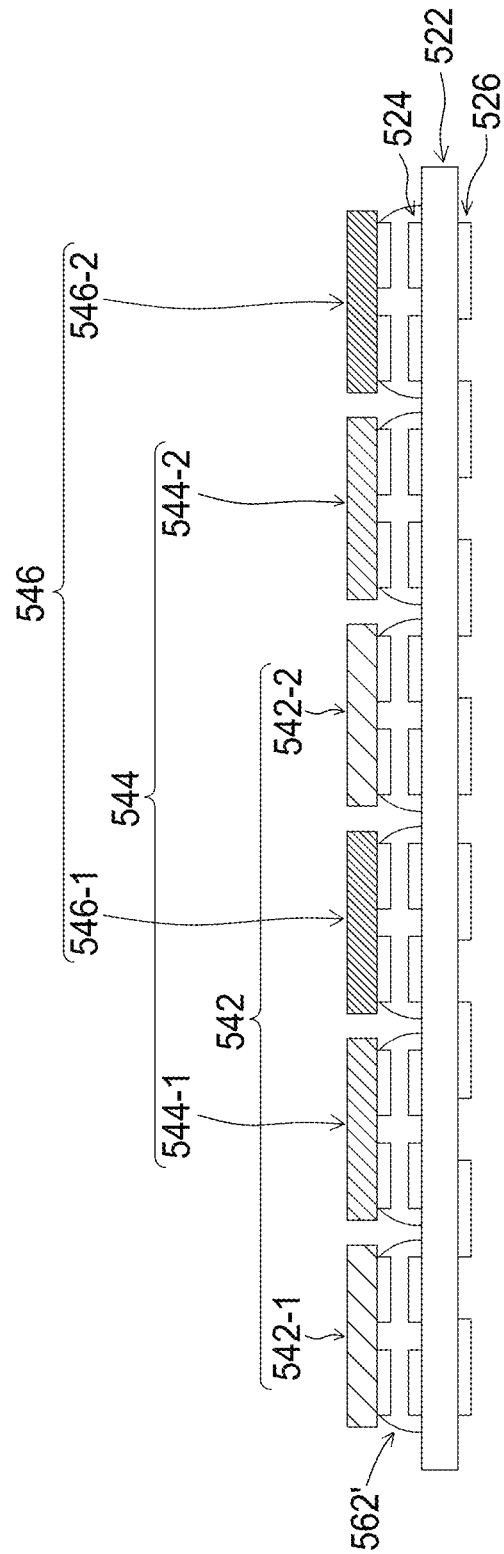

Referring to FIG. 5D, in one embodiment, groups 542, 544, 546 of multiple light-emitting units are formed on the same carrier, and the multiple light-emitting units 542-1, 544-1, 546-1, 542-2, 544-2, 546-2 are respectively formed on different unsolidified blocks 562' on the upper conductive layer 524. In FIG. 5D, in each of the groups, the number of the light-emitting units is 2, but not limited to, or can be an integer larger 1.

FIG. 5E and FIG. 5F respectively show detailed structures of one unsolidified block and one solidified block connecting the light-emitting unit 542-1 and carrier 520. Referring to 5E, the electrically conductive particles 562'-2 in the unsolidified blocks 562' are spread in a protection portion 562'-1. The protection portion 562'-1 has not solidified, so protection portion 562'-1 is in liquid state. In one embodiment, during solidifying process, the viscosity of the protection portion 562'-1 is firstly decreased and then increased, and the electrically conductive particles 562'-2 gather between or surrounding the electrodes 542-1a, 542-1b of the light-emitting unit 542-1 and the upper conductive layer 524. The electrically conductive particles 562'-2 experience a molten state during gathering. Referring to 5F, after the protection portion 562'-1 is solidified, the electrically conductive particles 562'-2 form electrical connecting portions 562-2, and the protection portion 562'-1 forms a solidified protection portion 562-1. In one embodiment, a part of the electrically conductive particles 562'-2 does not gather between or surrounding the electrodes 542-1a, 542-1b and the upper conductive layer 524, so the part of the electrically conductive particles 562'-2 separate to each other and exist between the electrical connecting portions 562-2.

Figure 5G:
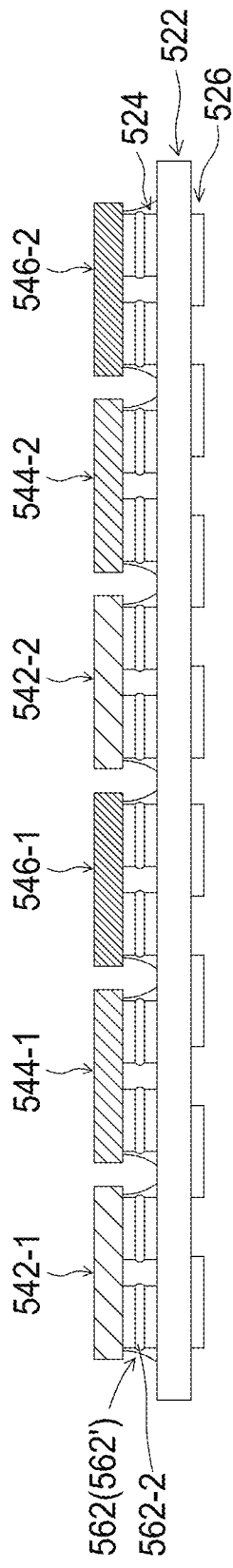
Figure 5H:
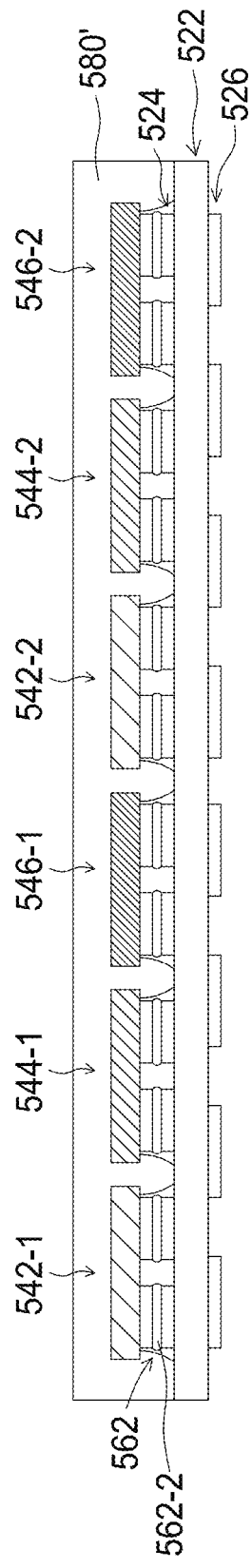

Referring to FIG. 5G, connecting structures 562 between the light-emitting units 542-1, 542-2 of the first group, the light-emitting units 544-1, 544-2 of a second group, the light-emitting units 546-1, 546-2 of a third group, and the upper conductive layer 524 are solidified and in electrical connecting state. In one embodiment, the solidification of the connecting structures 562 and the electrical connection among the light-emitting units 542-1, 542-2 of the first group, the light-emitting units 544-1, 544-2 of the second group, the light-emitting units 546-1, 546-2 of the third group, and the upper conductive layer 524 are formed at the same time. In another embodiment, the light-emitting units 542-1, 542-2 of the first group are disposed on the upper conductive layer 524, and the corresponding unsolidified blocks 562' can be firstly solidified and form electrical connection. After that, the light-emitting units 544-1, 544-2 of the second group are disposed on the upper conductive layer 524, and the corresponding unsolidified blocks 562' are solidified and form electrical connection. Then, the light-emitting units 546-1, 546-2 of the third group are disposed on the upper conductive layer 524, and the corresponding unsolidified blocks 562' are solidified and forms electrical connection. Referring to FIG. 5H, a transparent unit 580' is formed to cover the light-emitting units 542-1, 542-2 of the first group, the light-emitting units 544-1, 544-2 of the second group and the light-emitting units 546-1, 546-2 of the third group. In one embodiment, the transparent unit 580' continuously covers the light-emitting units 542-1, 542-2 of the first group, the light-emitting units 544-1, 544-2 of the second group and the light-emitting units 546-1, 546-2 of the third group. The method of forming the transparent unit 580' includes coating and molding processes. In one embodiment, after the transparent unit 580' covering the group of light-emitting units 542, the second group of light-emitting units 544 and the third group of light-emitting units 546, the transparent unit 580' is solidified.

Figure 5I:
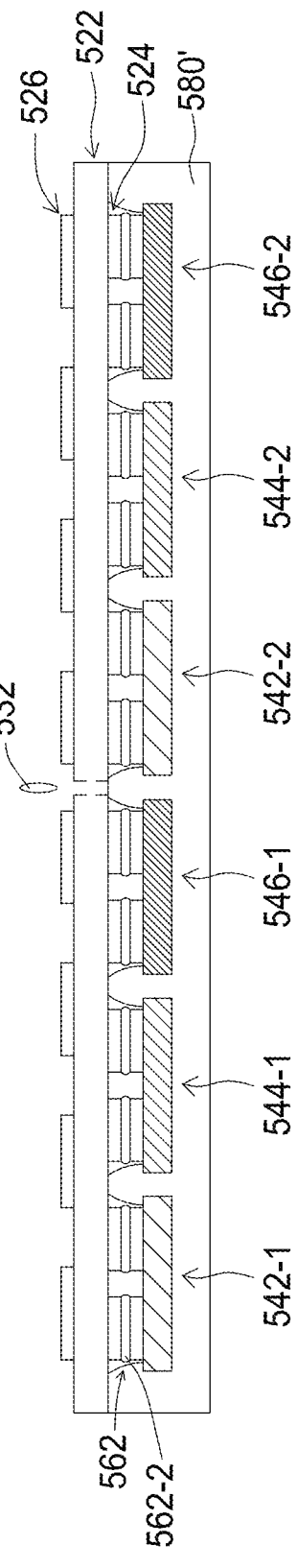
Figure 5J:
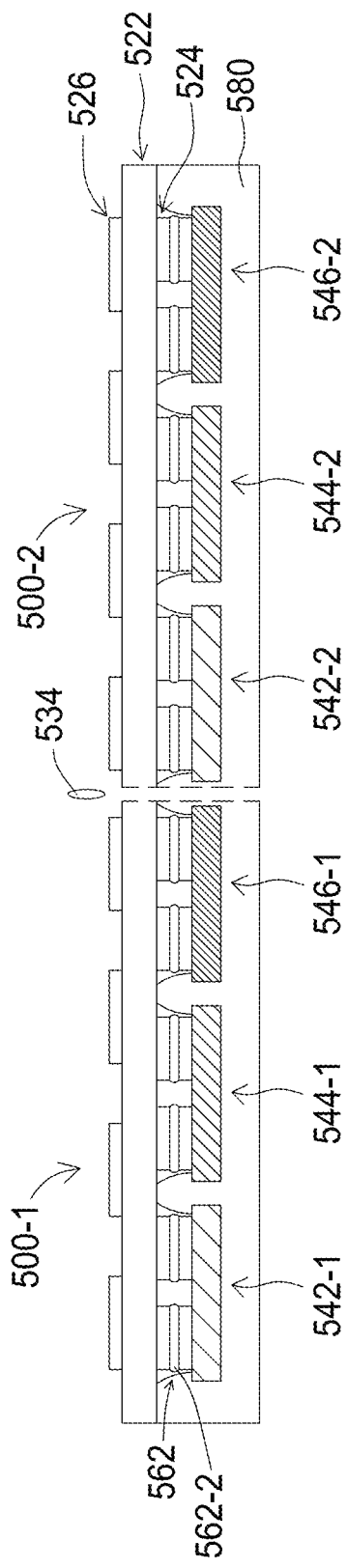

FIG. 5I and FIG. 5J show the steps of separating the light-emitting devices. In one embodiment, the insulating layer 522 of the carrier and the transparent unit 580' are separated in two steps. Referring to FIG. 5I, the first separation step includes cutting the insulating layer 522 of the carrier to form cutting lanes by a cutting tool 534. Referring to FIG. 5J, the second separation step includes cutting the transparent unit 580' to form light-emitting devices 500-1, 500-2 by a cutting tool 534. In another embodiment, the sequence of cutting the insulating layer 522 of the carrier and cutting the transparent unit 580' can be changed, so the transparent unit 580' can be separated before separating the insulating layer 522 of the carrier. In another embodiment, the insulating layer 522 and the transparent unit 580' can be separated in the same step so the side walls of the insulating layer 522 and the transparent unit 580 are able to be coplanar.

Figure 6A:
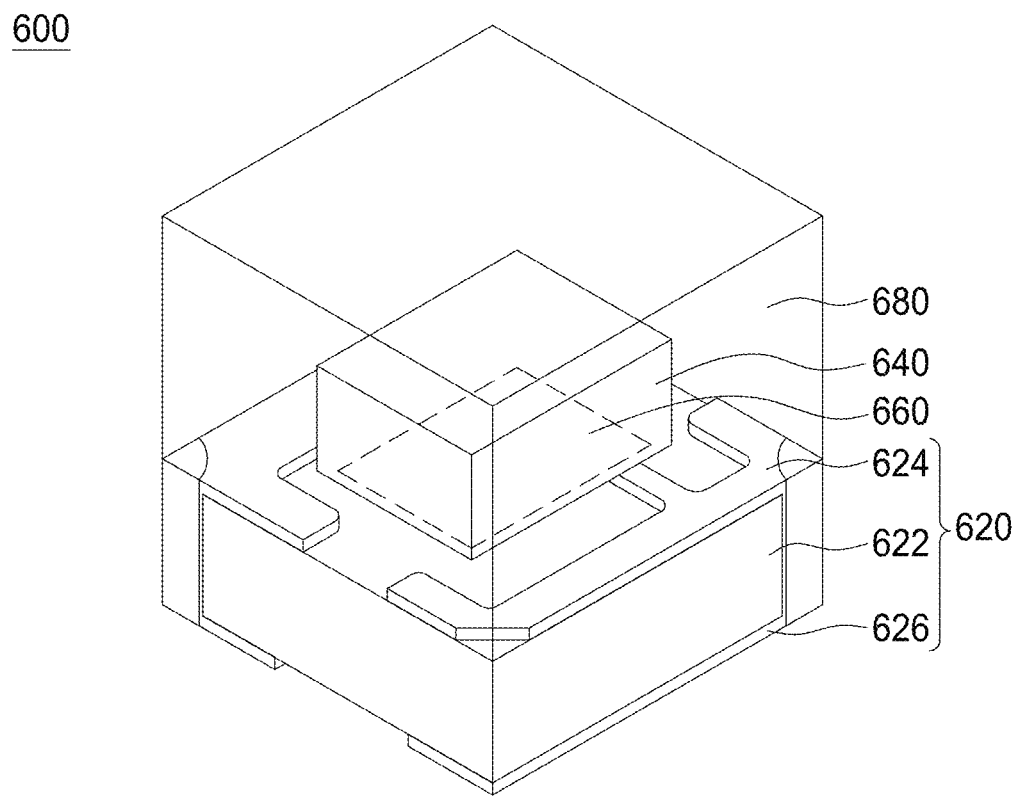
FIG. 6A shows a three-dimensional figure of a light-emitting device in accordance with one embodiment of present application.
Figure 6B:
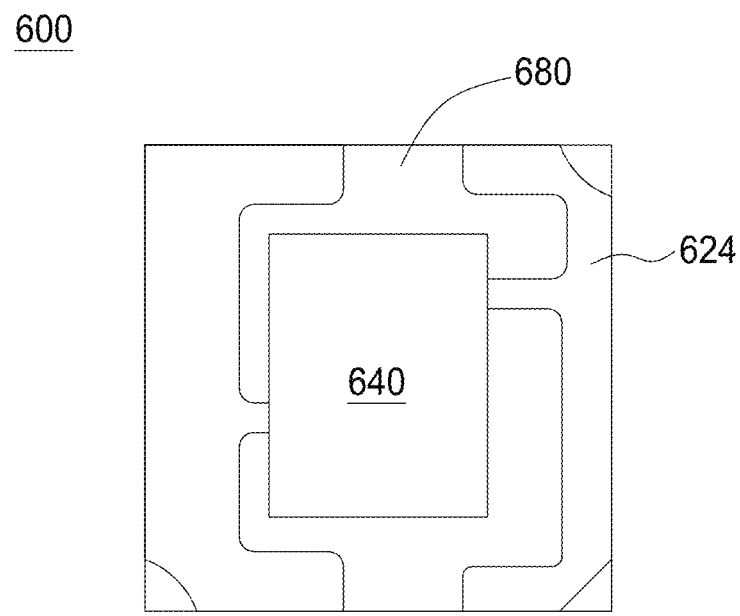
FIG. 6B shows a top view of the light-emitting device disclosed in FIG. 6A.
Figure 6C:
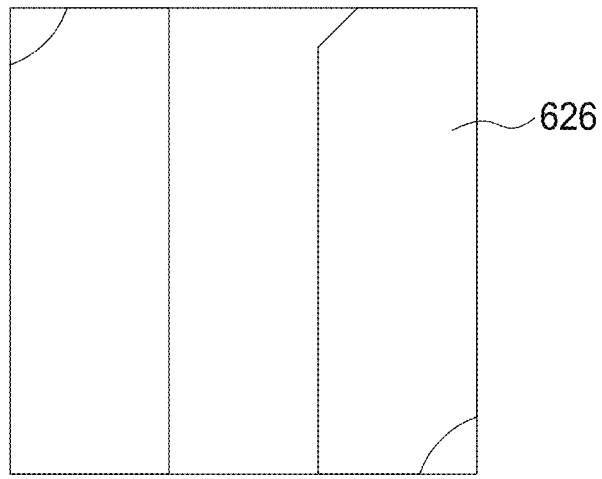
FIG. 6C shows a bottom view of the light-emitting device disclosed in FIG. 6A.

FIG. 6A shows a three-dimensional figure of a light-emitting device 600 in accordance with one embodiment of present application. FIG. 6B shows a top view of the light-emitting device 600. FIG. 6C shows a bottom view of the light-emitting device 600. The light-emitting device 600 includes a carrier 620, a light-emitting element 640, a connecting structure 660, and a transparent unit 680. In one embodiment, the light-emitting element 640 is formed on the carrier 620, the connecting structure 660 is formed between the carrier 620 and the light-emitting element 640, and the transparent unit 680 covers the light-emitting element 640 and the connecting structure 660. The specific structures, functions and forming methods of the carrier 620, the light-emitting element 640, the connecting structure 660 and the transparent unit 680 can be referred to FIG. 1 and the related paragraphs.

What differs the light-emitting device 600 in FIG. 6A from the light-emitting device 100 are the light-emitting element 640 including only one light-emitting unit for emitting a first light and the transparent unit 680 including wavelength conversion material excited by the first light for emitting a second light. In one embodiment, a light emitted from the light-emitting device 600 is a mixed light including at least two lights with different wavelengths and the color thereof is a white light. In one embodiment, the light-emitting element 640 comprises a blue light-emitting diode for emitting a first light when driven by an electrical power. The first light has a dominant wavelength or a peak wavelength between 430 nm~490 nm. In another embodiment, the light-emitting element 640 comprises a UV light-emitting diode, and the first light has a dominant wavelength or a peak wavelength between 400 nm~430 nm. The wavelength conversion material in the transparent unit 680 can be wavelength conversion particles dispersed in the transparent unit (not shown).

In one embodiment, after the wavelength conversion material absorbs the first light, such as UV or blue light, the wavelength conversion material is excited to emit a second light which is a yellow light, of which the dominant wavelength or peak wavelength is between 530 nm~590 nm. In another embodiment, after the wavelength conversion material absorbs the first light, such as UV or blue light, the wavelength conversion material is excited to emit a second light which is a green light, of which the dominant wavelength or peak wavelength is between 515 nm~575 nm. In another embodiment, after the wavelength conversion material absorbs the first light, such as UV or blue light, the wavelength conversion material is excited to emit a second light which is a red light, of which the dominant wavelength or peak wavelength is between 600 nm~660 nm.

The wavelength conversion material comprises one type of wavelength conversion particles or multiple types of wavelength conversion particles. In one embodiment, the wavelength conversion material comprises multiple types of wavelength conversion particles being able to emit green and red lights. Thus, besides emitting the second light which is green light, the wavelength conversion material is able to emit a third light which is a red light and can be mixed with the first light, which is not absorbed, to form a mixed light. In another embodiment, the first light is completely or almost completely absorbed by the wavelength conversion material. In the description, "almost completely" means, in the mixed light, a light intensity of the first light is equal to or smaller than 3% of the light intensity of the second light or third light.

The material of the wavelength conversion material includes inorganic phosphor, organic fluorescent colorant, semiconductor or combination thereof. The semiconductor includes nano-crystal semiconductor, such as quantum dot.

Referring to FIG. 6B, a portion of an upper conductive layer 624 of the carrier 620 of the light-emitting device 600 is covered by the light-emitting element 640 and a portion thereof is exposed. Besides, the transparent unit 680 covers the light-emitting element 640 and the exposed upper conductive layer 624. Referring to FIG. 6C, a lower conductive layer 626 of the light-emitting device 600 includes two separating electrode pads. In one embodiment, one of the electrode pads has one bevel for identification purpose.

Figure 7:
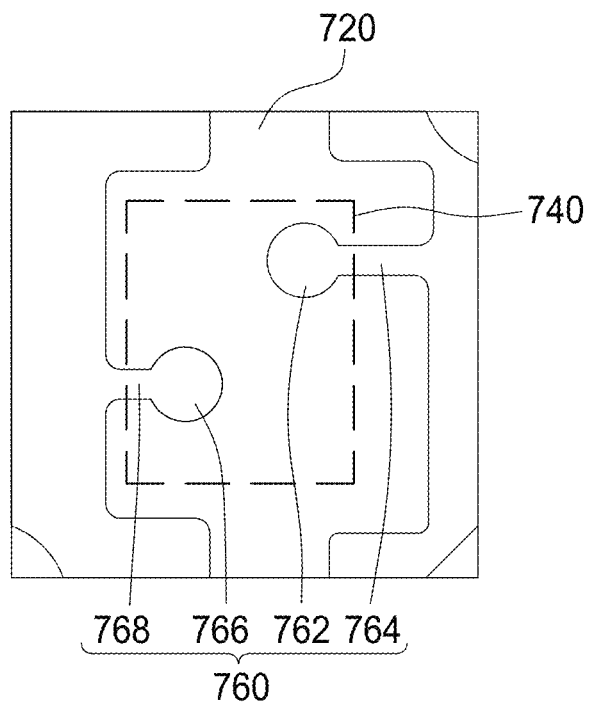
FIG. 7 shows a top view of a carrier of a light-emitting device in accordance with one embodiment of present application.

FIG. 7 shows a top view of a carrier 720 of a light-emitting device 700 in accordance with one embodiment of present application. In one embodiment, FIG. 7 and FIGS. 6A~6C describe the same embodiment, so FIG. 7 can be read with FIGS. 6A~6C. In one embodiment, the carrier 720 includes an upper conductive layer, and the upper conductive layer includes a connecting region 760. The connecting region 760 includes a first connecting portion 762, a first necking portion 764, a second connecting portion 766, and a second necking portion 768. In one embodiment, the connecting region 760 is corresponding to a light-emitting unit 740. The light-emitting unit 740 covers the first necking portion 764 and the second necking portion 768. The specific structure, function and forming method of the connecting region 760 can be referred to FIG. 2A or FIG. 4 and the related paragraphs.

Figure 8:
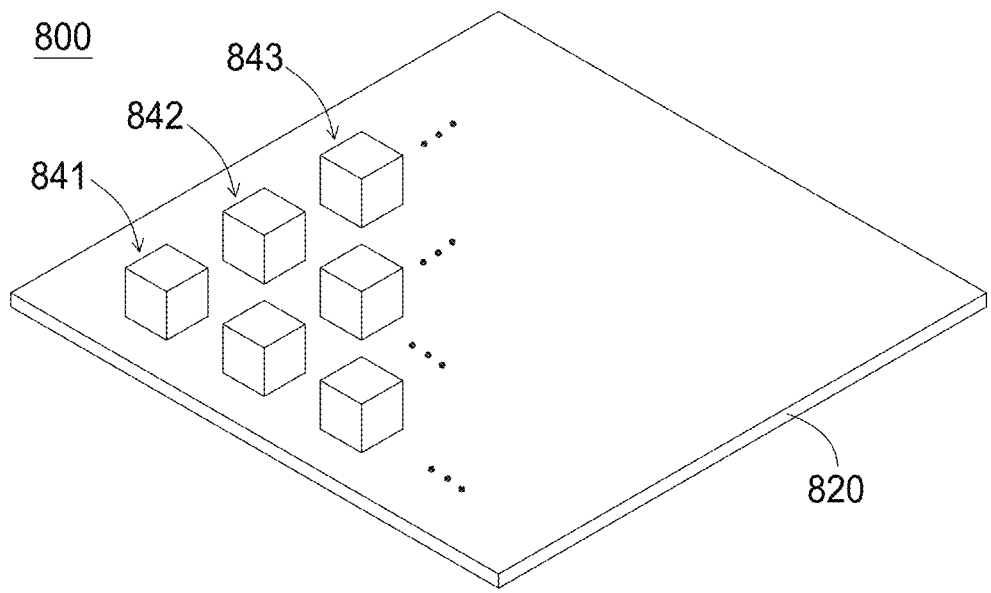
FIG. 8 shows a display module in accordance with one embodiment of present application.

FIG. 8 shows a display module 800 in accordance with one embodiment of present application. The display module 800 includes a carrier 820, such as a circuit board, and a plurality of light-emitting devices 841, 842, 843. In one embodiment, the plurality of light-emitting devices 841, 842, 843 is arranged in an array on the carrier 820 and electrically connects the circuit of the carrier 820. In one embodiment, each of the plurality of light-emitting devices 841, 842, 843 is a pixel, wherein the specific structure thereof can be a light-emitting device shown in FIGS. 1A~1D. A surface of the carrier 820 has a light-absorbing layer (not shown), such as black layer, for improving the contrast of the display module 800 as playing image. In one embodiment, in the top view, the shape of the plurality of light-emitting devices 841, 842, 843 is rectangle, such as square, and the size thereof is between 0.1 mm~1 mm. In another embodiment, the size of the plurality of light-emitting devices 841, 842, 843 is between 0.1 mm-0.5 mm. In another embodiment, the size of the plurality of light-emitting devices 841, 842, 843 is between 0.2 mm~2 mm. In another embodiment, the size of the plurality of light-emitting devices 841, 842, 843 is between 0.5 mm~1.2 mm. In another embodiment, the plurality of light-emitting devices 841, 842, 843 is a white light source, and the specific structure thereof can be the light-emitting device shown in FIGS. 6A~6C.

Figure 9A:
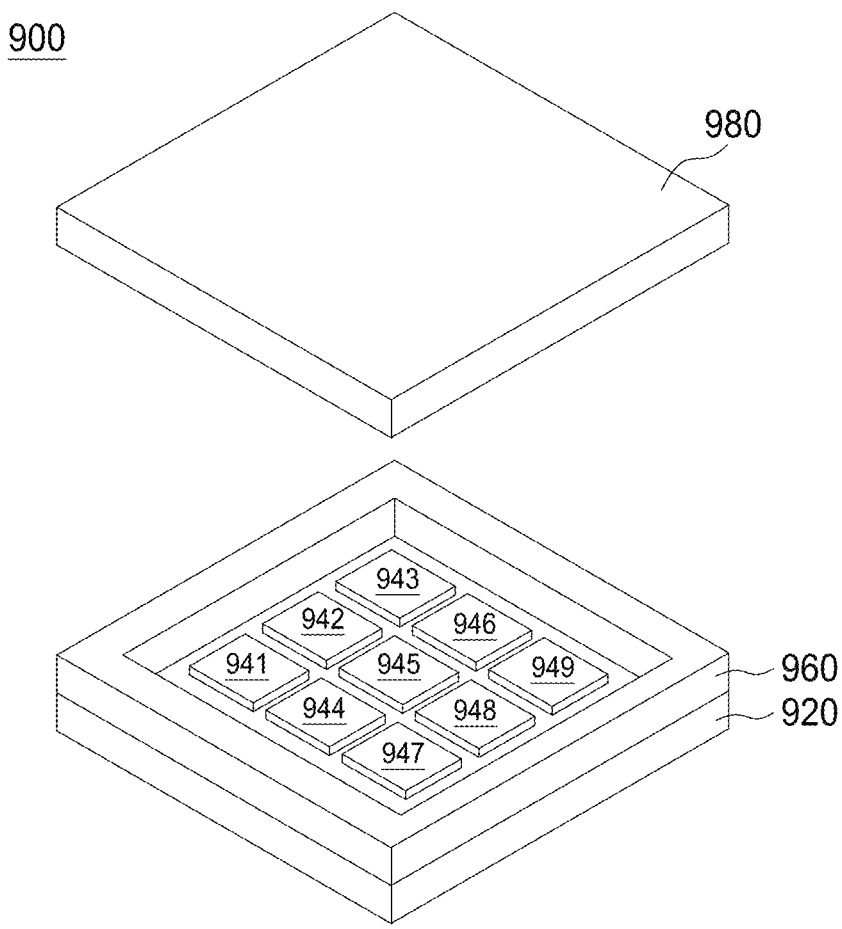
FIG. 9A shows a display device in accordance with one embodiment of present application.

FIG. 9A shows a display device 900 in accordance with one embodiment of present application. The display device 900 includes a carrier 920, a plurality of display modules 941~949 formed on the carrier 920, a frame 960 surrounds the plurality of display modules 941~949 and a panel covers the plurality of display modules 941~949 and the frame 960. In one embodiment, a gap between any two neighbor display modules of the plurality of display modules 941~949 can be very small, and any two neighbor display even lean against to each other.

Figure 9B:
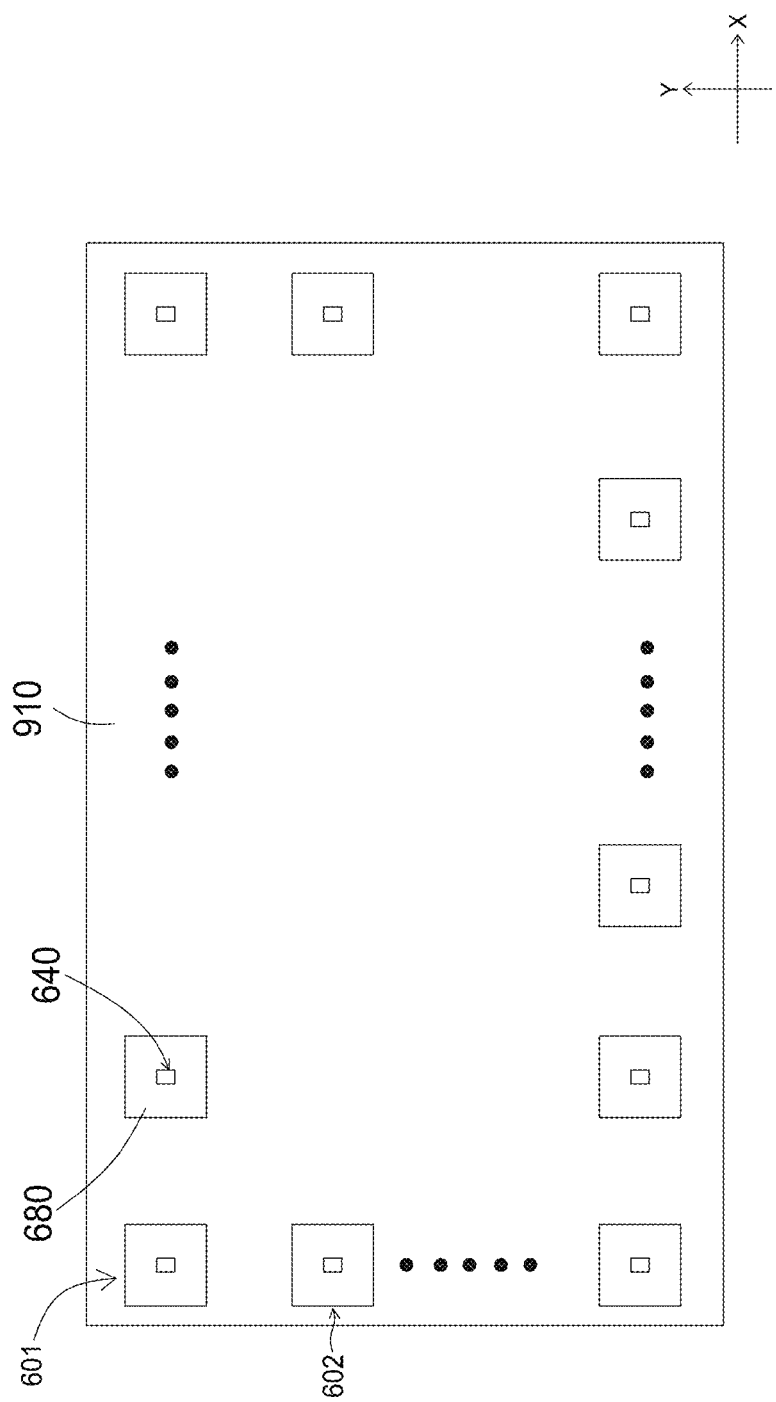
FIG. 9B shows a light-emitting module in accordance with one embodiment of present application.

FIG. 9B shows a light-emitting module 900B in accordance with one embodiment of present application. The light-emitting module 900B includes a carrier 910, a plurality of the light-emitting devices 601, 602 formed on the carrier 910. The light-emitting device 601 includes the light-emitting element 640 and the transparent unit 680. The plurality of the light-emitting devices 601, 602 can be arranged as an array on the carrier 910, and a surface of the carrier 910 has a circuit layer (not shown) for electrically connecting the plurality of the light-emitting devices 601, 602. In one embodiment, the plurality of the light-emitting devices 601, 602 is a white light source, and the specific structure thereof can be the light-emitting device shown in FIGS. 6A~6C. In one embodiment, the light-emitting module 900B is a backlight module of a display.

Figure 10A:
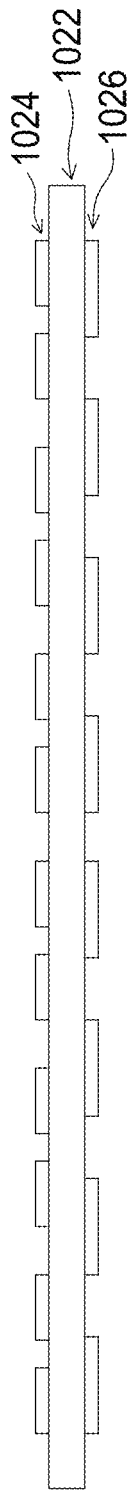

FIGS. 10A~10K show a process of manufacturing a display module 800 in accordance with one embodiment of present application. In one embodiment, the specific structure of the light-emitting device of the display module 800 refers to FIG. 1A. Referring to FIG. 10A, a carrier is provided. The carrier includes an insulating layer 1022, an upper conductive layer 1024 and a lower conductive layer 1026. The upper conductive layer 1024 and the lower conductive layer 1026 respectively have a plurality of connecting points. It is noteworthy that the width of each of the electrode pads of the lower conductive layer 1026 can be designedly larger than the width of each of the electrodes of the light-emitting units 542-1, 544-1, 546-1, 542-2, 544-2, 546-2 so the following step of inspection becomes easier. The specific structure of the insulating layer 1022, the upper conductive layer 1024 and the lower conductive layer 1026 can be referred to FIG. 5A and the related paragraphs.

Figure 10B:
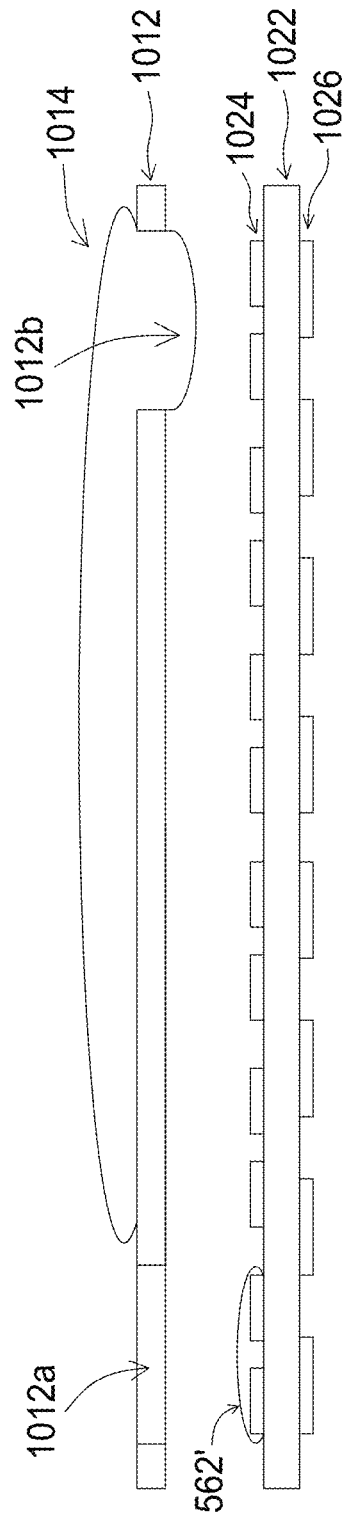
Figure 10C:
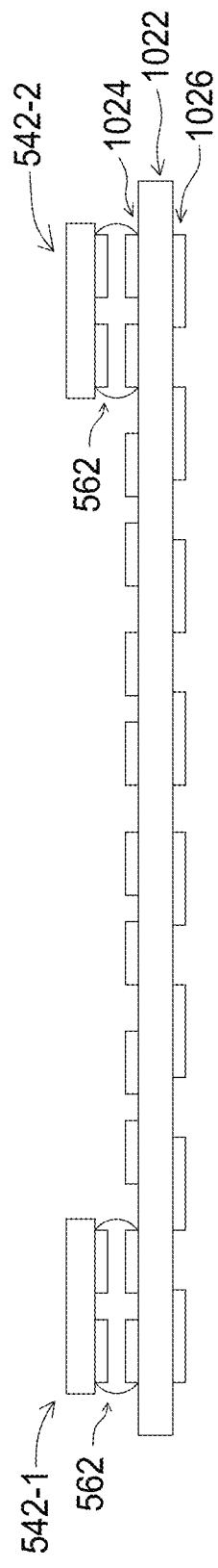
Figure 10D:
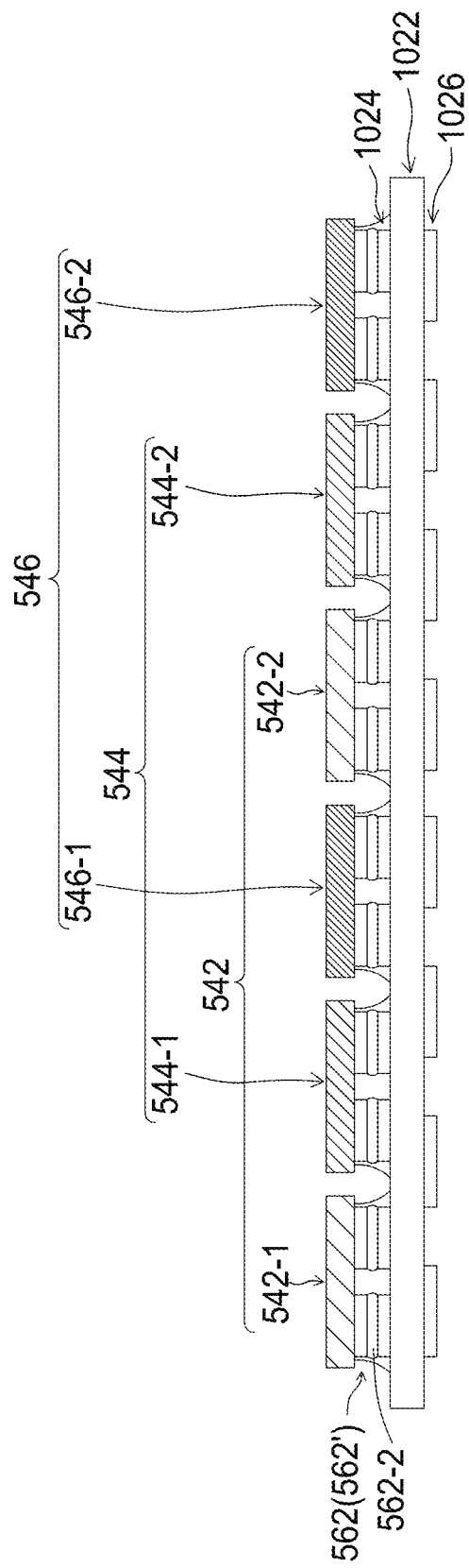

Referring to FIG. 10B, glue 1014 with electrically conductive particles (not shown) is formed on the upper conductive layer 1024 through holes 1012a, 1012b of a patterned jig 1012 and form unsolidified blocks 562'. The specific description of the glue 1014, the patterned jig 1012 and the unsolidified blocks 562' can be referred to FIG. 5B and the related paragraphs. Referring to FIG. 10C, the light-emitting units 542-1, 542-2 are connected with the unsolidified blocks 562' and formed on the upper conductive layer 1024. The function and the method of forming the light-emitting units 542-1, 542-2 on the upper conductive layer 1024 can be referred to the FIG. 5C and the related paragraphs. Referring to FIG. 10D, the light-emitting units of the first group 542, the second group 544, and the third group 546 are formed on the same carrier and the unsolidified blocks 562' are solidified to form the electrical connecting portions 562-2 electrically connecting to the upper conductive layer 1024. In one embodiment, there are at least three groups of the light-emitting units. The specific description of the group of the light-emitting units can be referred to FIG. 5B and the related paragraphs.

Figure 10E:
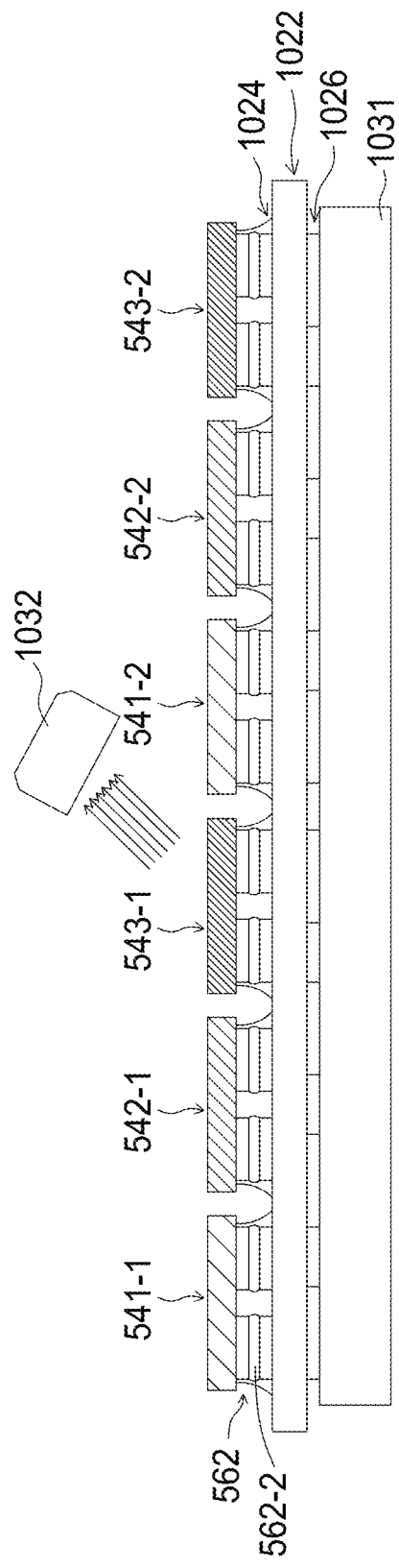

Referring to FIG. 10E, after the light-emitting units 542-1, 544-1, 546-1, 542-2, 544-2, 546-2 electrically connecting to the upper conductive layer 1024, the step of inspection can be performed. In one embodiment, the step of inspection is conducted by an inspecting device to inspect the light-emitting units 542-1, 544-1, 546-1, 542-2, 544-2, 546-2. The inspecting device includes a inspecting board 1031 and a sensing unit 1032 to check whether each of the light-emitting units 542-1, 544-1, 546-1, 542-2, 544-2, 546-2 meets the criteria for screening out the unqualified units. The inspecting board 1031 is able to electrically connect to the lower conductive layer 1026. In one embodiment, the width or area of the lower conductive layer 1026 is larger than the width or area of each of the electrodes of the light-emitting units 542-1, 544-1, 546-1, 542-2, 544-2, 546-2, Thus, even the size of each of the light-emitting units 542-1, 544-1, 546-1, 542-2, 544-2, 546-2 is small, it is easier to conduct the inspection by the inspecting device. The criteria of the inspection include wavelength, intensity or Chromatic coordinate value. The unqualified units are inspected in the step of inspection so the yield of manufacturing the display module 800 can be improved and the number of times of repairing the display module 800 can be decreased.

Figure 10F:
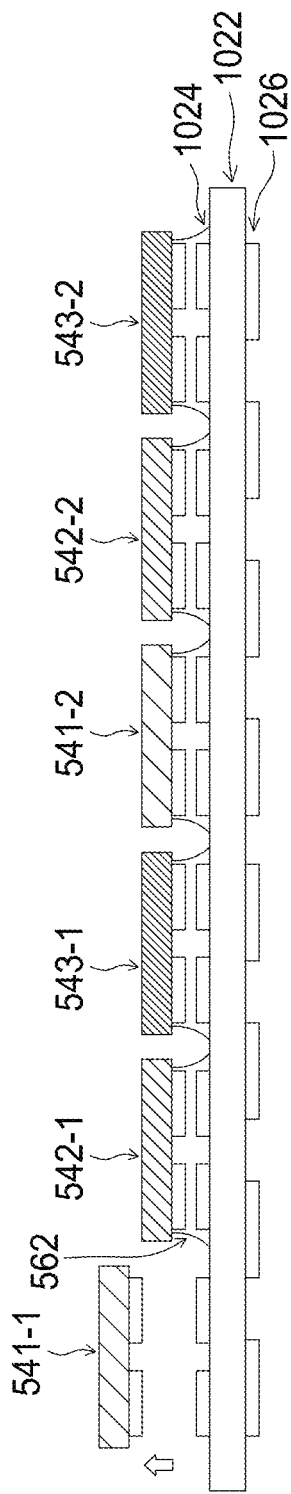
Figure 10G:
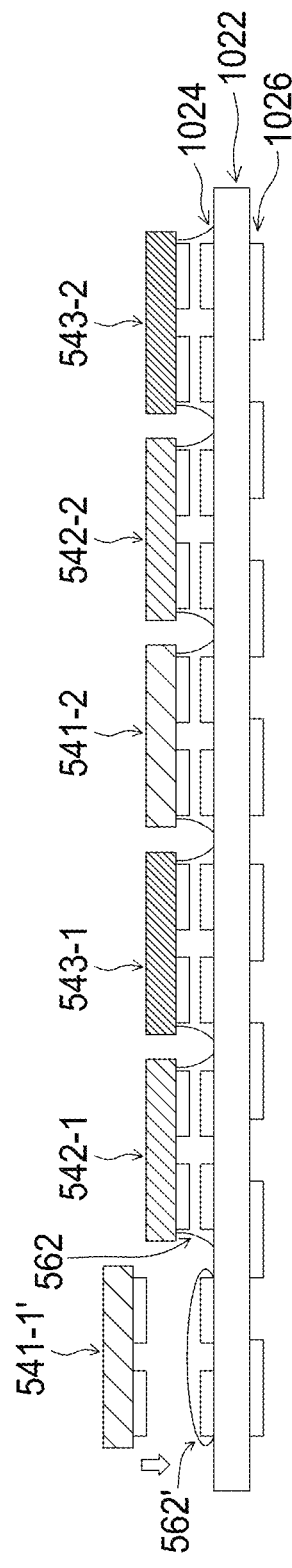

Referring to FIG. 10F, as the light-emitting unit 542-1 is identified as an unqualified unit in the inspection step, referring to FIG. 10F, the light-emitting unit 542-1 can be removed. In one embodiment, the adhesion between the light-emitting unit 542-1 and the carrier can be decreased by heating, and then the light-emitting unit 542-1 can be removed. Referring to FIG. 10G, another light-emitting unit 542-1' is formed on the position of the light-emitting unit 542-1 with another unsolidified block 562'.

Figure 10H:
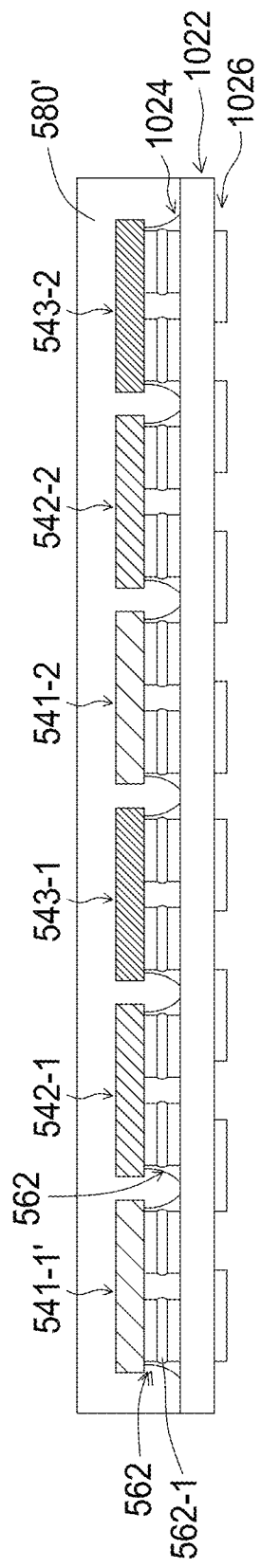

Referring to FIG. 10H, the first light-emitting units 542-1', 542-2, the second light-emitting units 544-1, 544-2 and the third light-emitting units 546-1, 546-2 are covered by the transparent unit 580'. The functions and the forming method of the transparent unit 580' can be referred to FIG. 5H and the related paragraphs. Referring to FIG. 10I, a first separation step for forming the light-emitting device includes cutting the insulating layer 1022 of the carrier for forming a cutting line by using a cutting tool 532. Referring to FIG. 10J, a second separation step for forming the light-emitting device includes cutting the transparent unit 580' for forming the light-emitting devices 1001, 1002 by using a cutting tool 534. The function and the forming method of separating the light-emitting devices can be referred to FIGS. 5I and 5J and the related paragraphs.

Referring to FIG. 10K, in a transfer step, the separated light-emitting devices 1001, 1002, 1003 are transferred from a temporary substrate 1031' to a target substrate 1032 for forming the display module 800. The way for transferring the light-emitting devices 1001, 1002, 1003 to the target substrate 132 can be one by one or once all together.

Figure 11A:
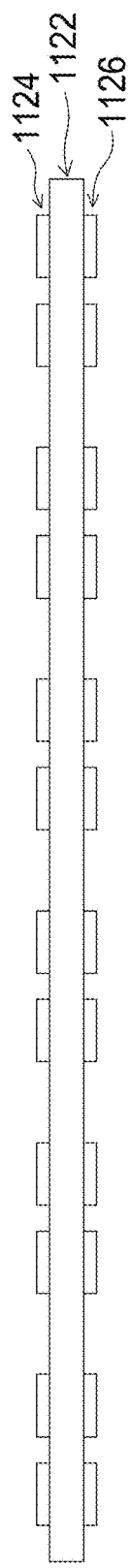

FIGS. 11A~11I show a manufacturing process of the display module 800 in accordance with one embodiment of present application. In one embodiment, the description of the structure of the light-emitting device in the display module 800 can be referred to FIG. 6A. Referring to FIG. 11A, a carrier is provided. The carrier includes an insulating layer 1122, an upper conductive layer 1124 and a lower conductive layer 1126. The upper conductive layer 1124 and the lower conductive layer 1126 respectively have a plurality of connecting points. The description of the structures of the insulating layer 1122, the upper conductive layer 1124 and the lower conductive layer 1126 can be referred to FIGS. 5A, 10A and the related paragraphs.

Figure 11B:
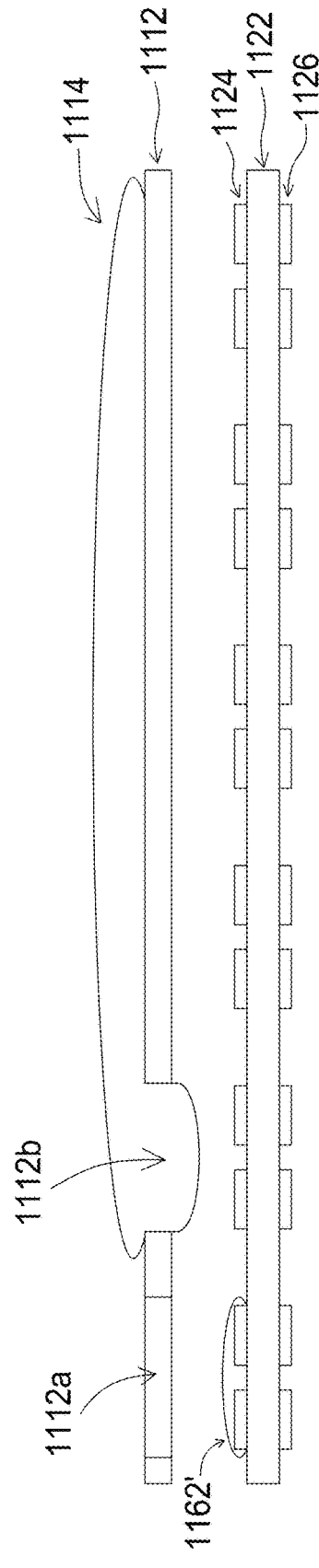
Figure 11C:
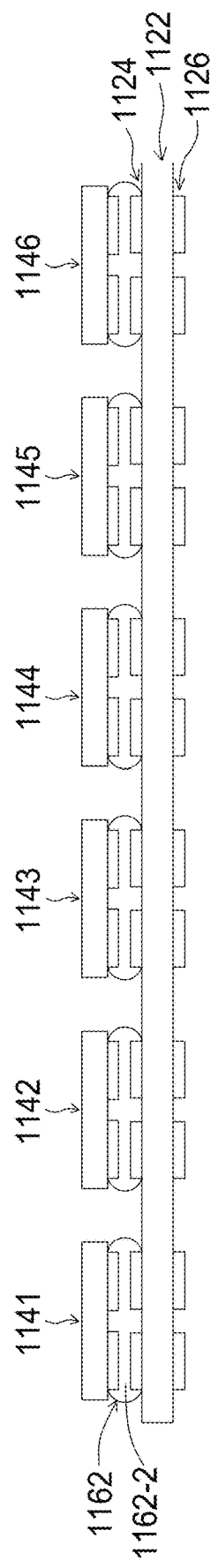

Referring to FIG. 11B, glue 1114 with electrically conductive particles (not shown) forms unsolidified blocks 1162' on the upper conductive layer 1124 through holes 1112a, 1112b of a patterned jig 1112. The details of the glue 1114, the patterned jig 1112 and the unsolidified blocks 1162' can be referred to FIG. 5B and the related paragraphs. Referring to FIG. 11C, the light-emitting units 1141, 1142, 1143, 1144, 1145, 1146 are connected with the unsolidified blocks 1162' and formed on the upper conductive layer 1124. The function of the light-emitting units 1141, 1142, 1143, 1144, 1145, 1146 and the forming method thereof on the upper conductive layer 1124 can be referred to FIG. 5C and the related paragraphs. Referring to FIG. 11D, the light-emitting units 1141, 1142, 1143, 1144, 1145, 1146 are formed on the same carrier, and then the unsolidified blocks 1162' are solidified to form electrical connecting portions 1162-2 electrically connecting with the upper conductive layer 1124. A transparent unit 1180' is then formed to cover the light-emitting units 1141, 1142, 1143, 1144, 1145, 1146. The function and forming method of the transparent unit 1180' can be referred to FIG. 5H and the related paragraphs. In one embodiment, the before forming the transparent unit 1180', the light-emitting units 1141, 1142, 1143, 1144, 1145, 1146 can be inspected to check whether there are any unqualified units.

Referring to FIG. 11E, a step of inspecting the light-emitting units 1141, 1142, 1143, 1144, 1145, 1146 covered by the transparent unit 1180' are executed. The description of the inspection step can be referred to FIG. 10E and the related paragraphs. In one embodiment, the transparent unit 1180' includes wavelength conversion material, so the lights for inspection are the mixed lights of the lights from the light-emitting units 1141, 1142, 1143, 1144, 1145, 1146 and the lights excited by the wavelength conversion material.

Figure 11F:
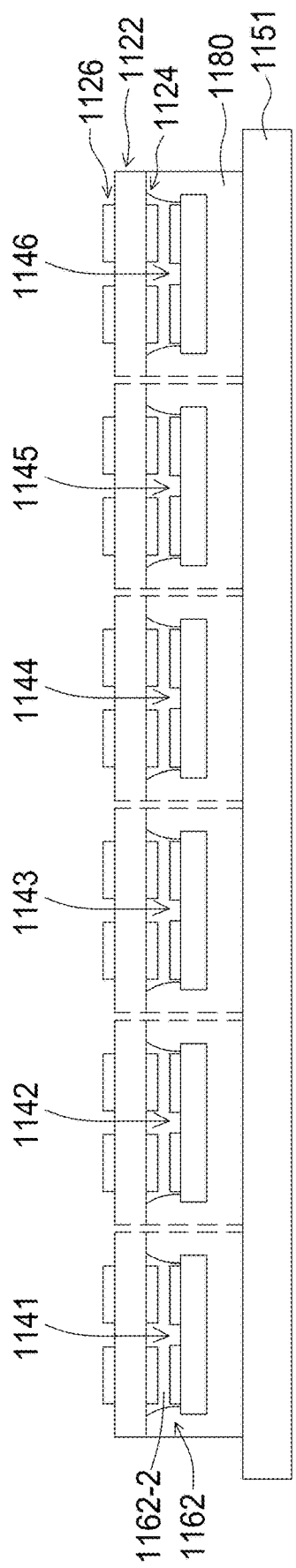
Figure 11G:
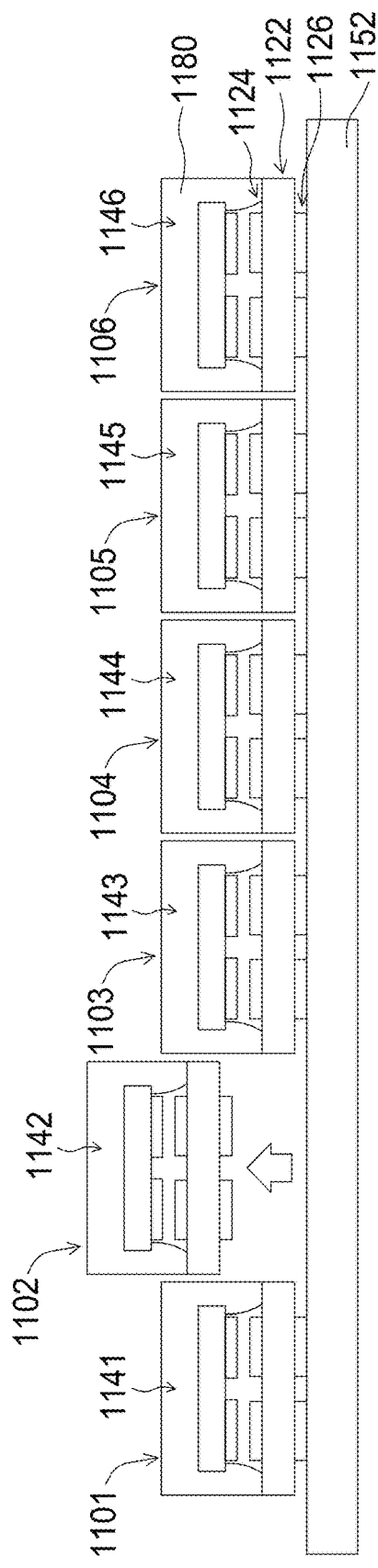
Figure 11H:
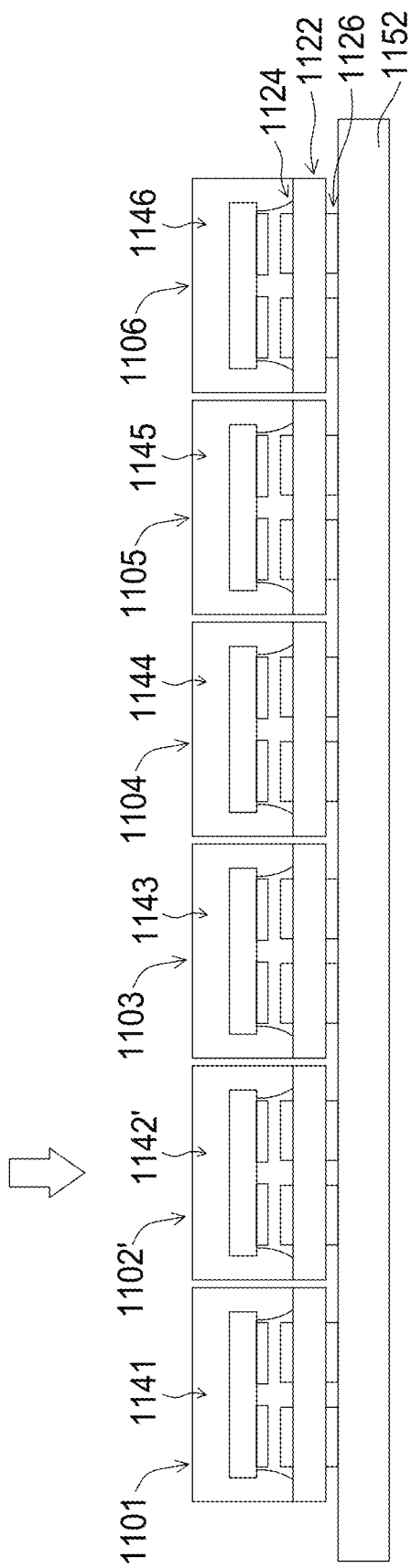

Referring to FIG. 11F, the step of separating the light-emitting devices includes cutting the insulating layer 1122 and the transparent unit 1180' shown in FIG. 11D. The transparent unit 1180' in FIG. 11D is cut to form separate transparent units 1180. The detailed description of the step of separating the light-emitting devices can be referred to FIGS. 5I and 5J the related paragraphs. In one embodiment, after detecting the light-emitting devices 1101, 1102, 1103, 1104, 1105, 1106 formed after the separation step, the light-emitting device 1102 is determined as unqualified in the inspection step. Referring to FIG. 11G, after the light-emitting devices 1101, 1102, 1103, 1104, 1105, 1106 are formed on a temporary substrate 1152, the light-emitting device 1102 can be removed from the temporary substrate 1152. FIG. 11H shows that a light-emitting device 1102' is formed and replaces the light-emitting device 1102. In another embodiment, after the light-emitting device 1102 is removed from the temporary substrate 1152, it is not necessary to place another light-emitting device and a vacancy is formed (not shown).

Figure 11I:
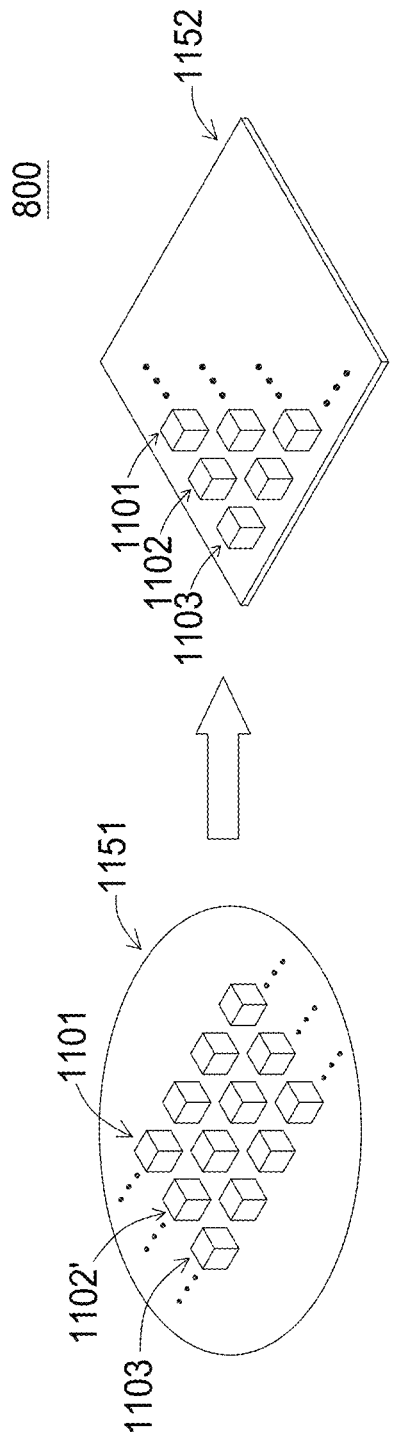

Referring to FIG. 11I, in a transfer step, the multiple light-emitting devices 1101, 1102', 1103 are transferred from a temporary substrate 1151 to a target substrate 1152 for forming a display module 800. The way to transfer the light-emitting devices 1101, 1102', 1103 to the target substrate 1152 can be done one by one or once all together.

Figure 12A:
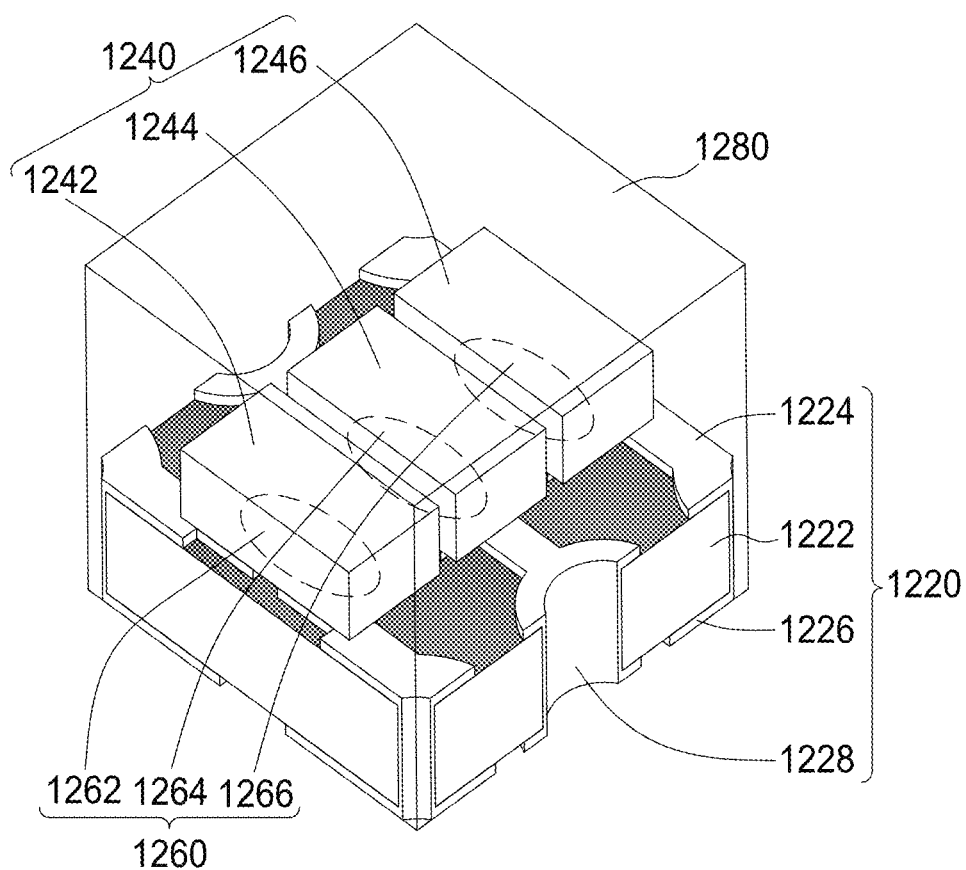
FIG. 12A shows a three-dimensional figure of a light-emitting device in accordance with one embodiment of present application.
Figure 12B:
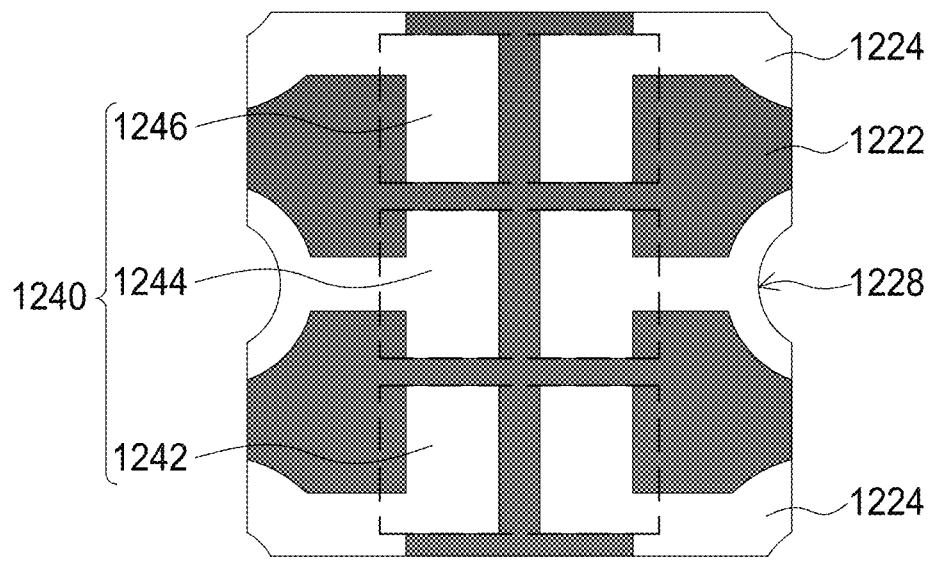
FIG. 12B shows a top view of the light-emitting device disclosed in FIG. 12A.
Figure 12C:
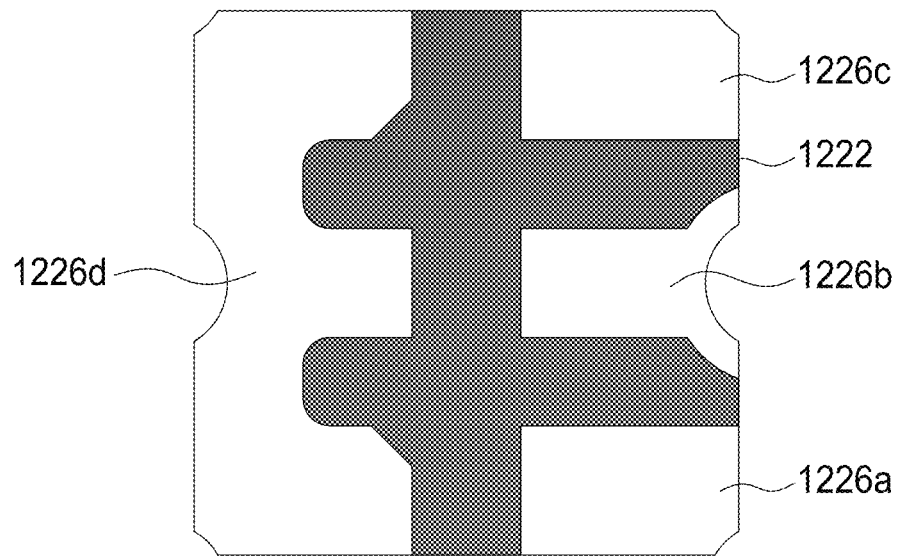
FIG. 12C shows a bottom view of the light-emitting device disclosed in FIG. 12A.

FIG. 12A shows a three-dimensional figure of a light-emitting device 1200 in accordance with one embodiment of present application. FIG. 12B shows a top view of the light-emitting device 1200 disclosed in FIG. 12A, and FIG. 12C shows a bottom view of the light-emitting device 1200 disclosed in FIG. 12A. The light-emitting device 1200 includes a carrier 1220, a light-emitting element 1240, a connecting structure 1260 and a transparent unit 1280. The structure, function and the manufacturing method of the carrier 1220, the light-emitting element 1240, the connecting structure 1260 and the transparent unit 1280 can be referred to the related paragraphs of the light-emitting device 100.

The difference between the light-emitting device 1200 and the light-emitting device 100 includes the structure of the carrier 1220 and arrangement of the light-emitting units 1242, 1244, 1246. In one embodiment, the carrier 1220 includes an insulating layer 1222, an upper conductive layer 1224, a lower conductive layer 1226, and conductive through holes 1228. The upper conductive layer 1224 includes six connecting portions (or three pairs of upper pads) and six necking portions (or six conductive traces), wherein two upper pads of each pairs are adjacent to but separate from each other. Besides, each pair of the upper pads is corresponding each of the light-emitting units 1242, 1244, 1246. Referring to FIG. 12B, in one embodiment, from up to down, the first light-emitting unit 1242, the second light-emitting unit 1244 and the third light-emitting unit 1246 are arranged sequentially and respectively correspond to one pair of the upper pads. The first light-emitting unit 1242, the second light-emitting unit 1244, and the third light-emitting unit 1246 are arranged as a character of "=" (or " ⫿ "). In one embodiment, the upper pads are arranged in an array of 3×2 for corresponding to the arrangement of light-emitting units 1242, 1244, 1246. Besides, the three traces are parallel to each other and extend from the inner side of the upper conductive layer 1224 to the same side (first side). Similarly, another three traces are parallel to each other and extends from the inner side of the upper conductive layer 1224 to the other side (second side).

The details of patterned structure of the lower conductive layer 1226 can be referred to FIG. 12C. In one embodiment, the lower conductive layer 1226 includes a first lower conductive pad 1226a, a second lower conductive pad 1226b, a third lower conductive pad 1226c and a fourth lower conductive pad 1226d. The material and function of the lower conductive layer 1226 can be referred to FIG. 1C and the related paragraphs. Referring to FIG. 12C, each of the first lower conductive pad 1226a, the second lower conductive pad 1226b, and the third lower conductive pad 1226c has a long side and a short side. The fourth lower conductive pad 1226d is a common electrode, and the fourth lower conductive pad 1226d has two concave portions and three convex portions, wherein the three convex portions are respectively correspond to the first lower conductive pad 1226a, the second lower conductive pad 1226b and the third lower conductive pad 1226c. Thus, when the light-emitting device 1200 electrically connects with a circuit board in a subsequent process, the distribution of the electrically connecting material, such as solder, between the lower conductive layer 1226 and the circuit board can be more uniform for preventing "Tombstone" phenomenon. In one embodiment, there are six conductive through holes 1228 respectively connecting the six traces and being located on the four corners and center positions of two sides, wherein each of the two sides means the side which each of the three traces connect to. In one embodiment, the side of the light-emitting device 1200 is smaller than 500 μm and a distance between two upper pads of each pair is smaller than 100 μm and the length of each of the short sides of lower conductive pad 1226a, 1226b, 1226c is smaller than 150 μm.

Figure 13A:
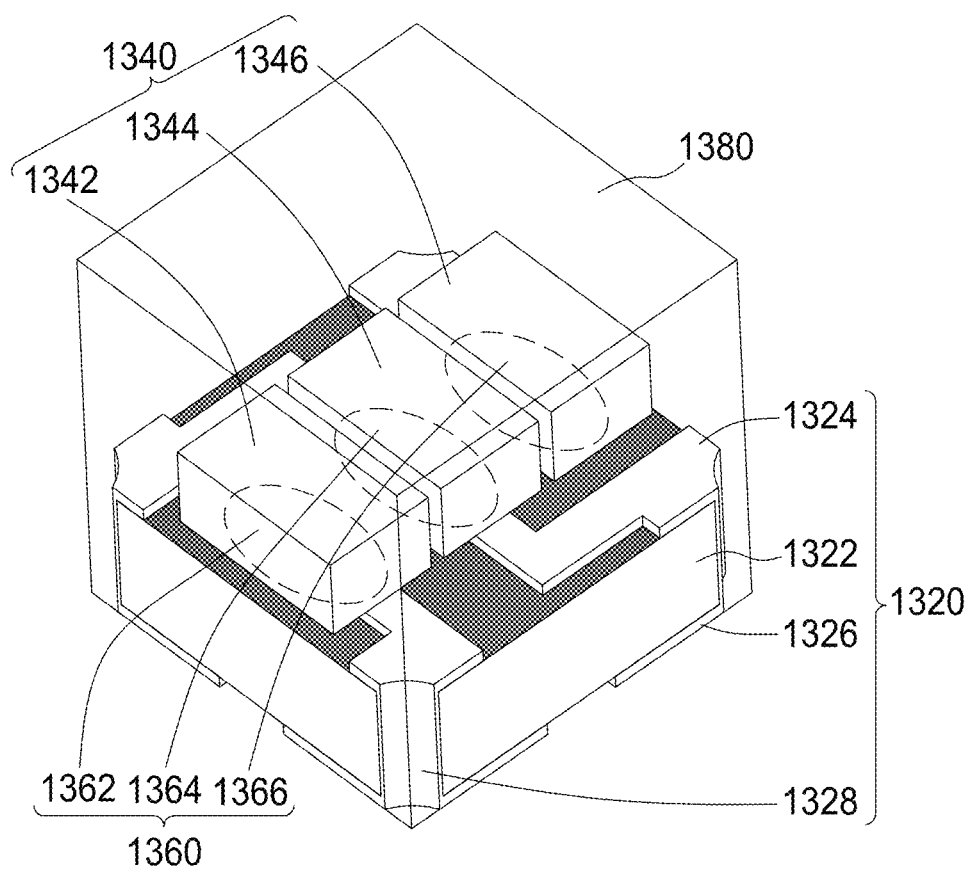
FIG. 13A shows a three-dimensional figure of a light-emitting device in accordance with one embodiment of present application.
Figure 13B:
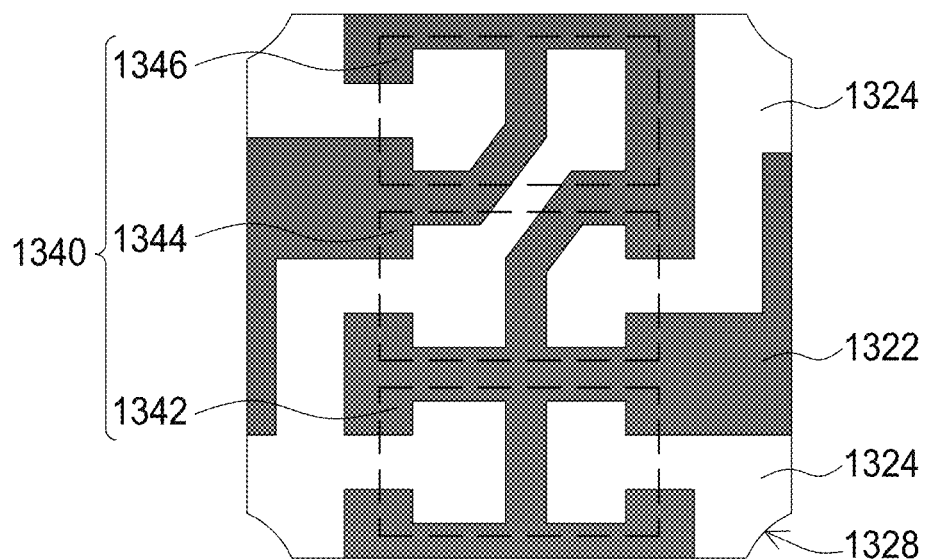
FIG. 13B shows a top view of the light-emitting device disclosed in FIG. 13A.
Figure 13C:
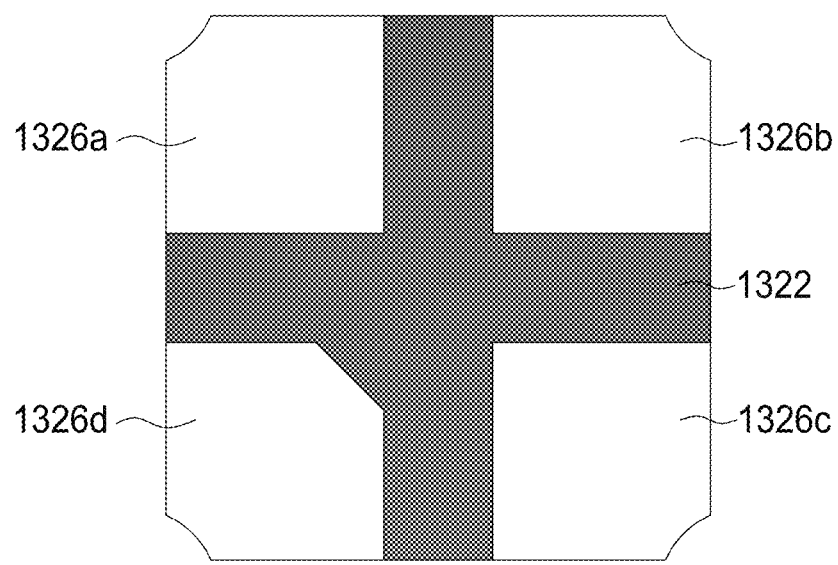
FIG. 13C shows a bottom view of the light-emitting device disclosed in FIG. 13A.

FIG. 13A shows a three-dimensional figure of a light-emitting device 1300 in accordance with one embodiment of present application. FIG. 13B shows a top view of the light-emitting device 1300 disclosed in FIG. 13A. FIG. 13C shows a bottom view of the light-emitting device 1300 disclosed in FIG. 13A. The light-emitting device 1300 includes a carrier 1320, a light-emitting element 1340, a connecting structure 1360 and a transparent unit 1380. The structures, functions and the manufacturing method of the carrier 1320, the light-emitting element 1340, the connecting structure 1360 and the transparent unit 1380 can be referred to the related paragraphs of the light-emitting device 100.

The difference between the light-emitting device 1300 and the light-emitting device 100 includes the structure of the carrier 1320 and the arrangement of the light-emitting units 1342, 1344, 1346 of the light-emitting element 1340. In one embodiment, the carrier 1320 includes an insulating layer 1322, an upper conductive layer 1324, a lower conductive layer 1326, and conductive through holes 1328. The details of the patterned structure of the upper conductive layer 1324 can be referred to FIG. 13B. The upper conductive layer 1324 includes six connecting portions (or three pairs of upper pads) and six necking portions (or six conductive traces). The arrangement of the upper pads and the light-emitting element 1340 can be referred to FIG. 12B and the related paragraphs. The difference between the upper conductive layer 1324 and the upper conductive layer 1224 disclosed in FIG. 12B is that the upper conductive layer 1324 includes at least two conductive traces for connecting two upper pads.

The details of patterned structure of the lower conductive layer 1326 can be referred to FIG. 13C. In one embodiment, the lower conductive layer 1326 includes a first lower conductive pad 1326a, a second lower conductive pad 1326b, a third lower conductive pad 1326c, and a fourth lower conductive pad 1326d. The materials and functions of the lower conductive pads 1326a, 1326b, 1326c, 1326d can be referred to FIG. 1C and the related paragraphs. In one embodiment, the four conductive through holes 1328 are respectively located in the four corners of the carrier 1320. In one embodiment, at least one side length of the light-emitting device 1300 is smaller than 500 μm, a gap between any neighboring two lower conductive pads 1326a, 1326b, 1326c, 1326d is smaller than 200 μm, and a side length of each of the lower conductive pads 1326a, 1326b, 1326c, 1326d is smaller than 200 μm.

Figure 14A:
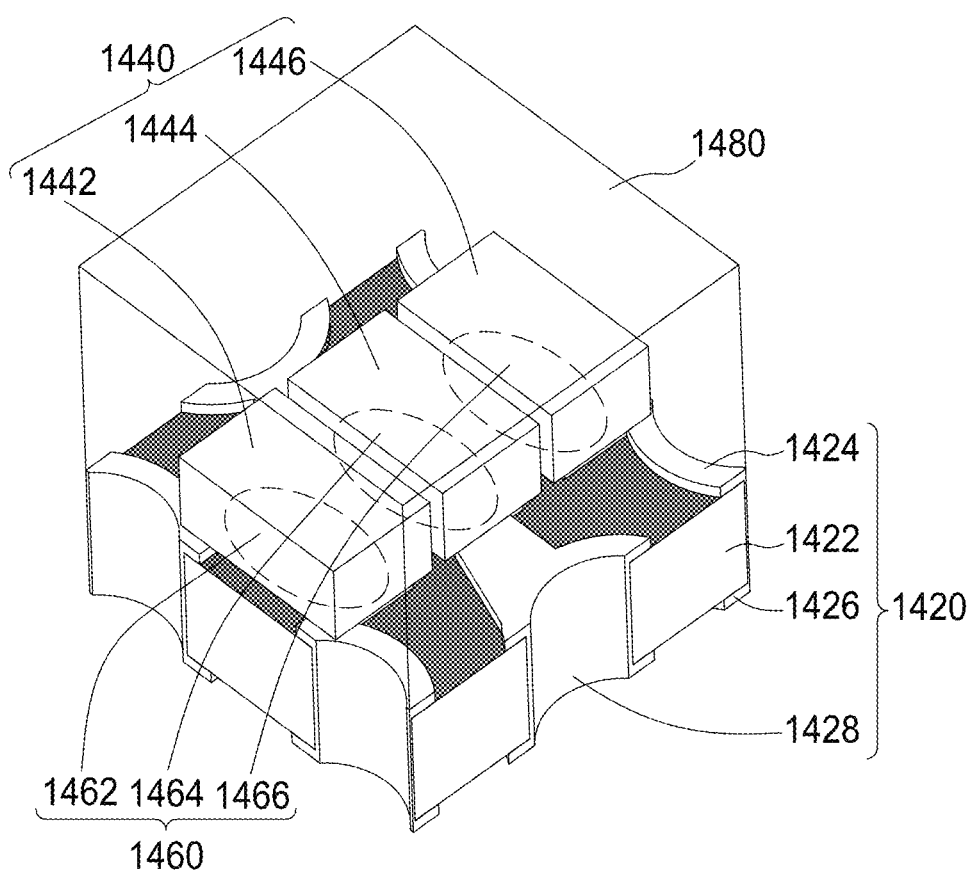
FIG. 14A shows a three-dimensional figure of a light-emitting device in accordance with one embodiment of present application.
Figure 14B:
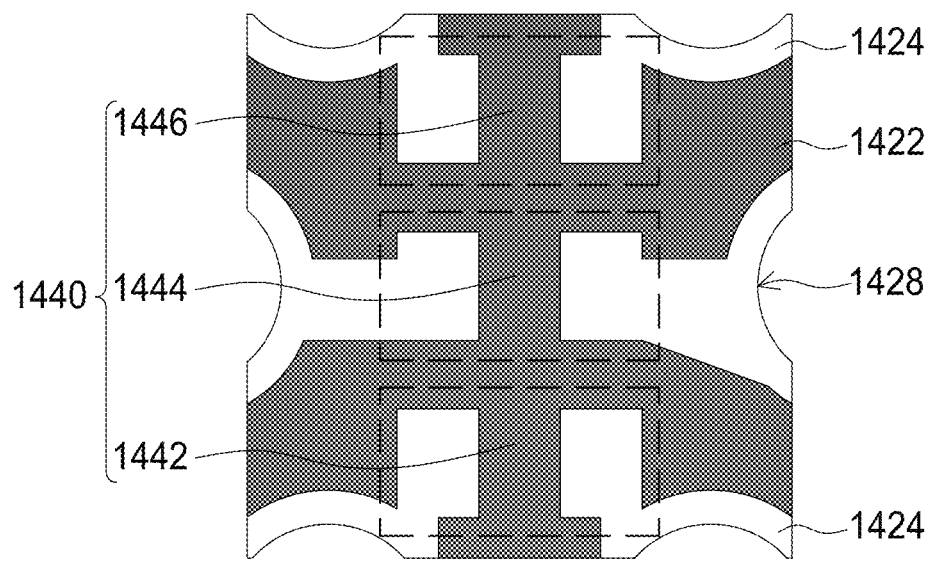
FIG. 14B shows a top view of the light-emitting device disclosed in FIG. 14A.
Figure 14C:
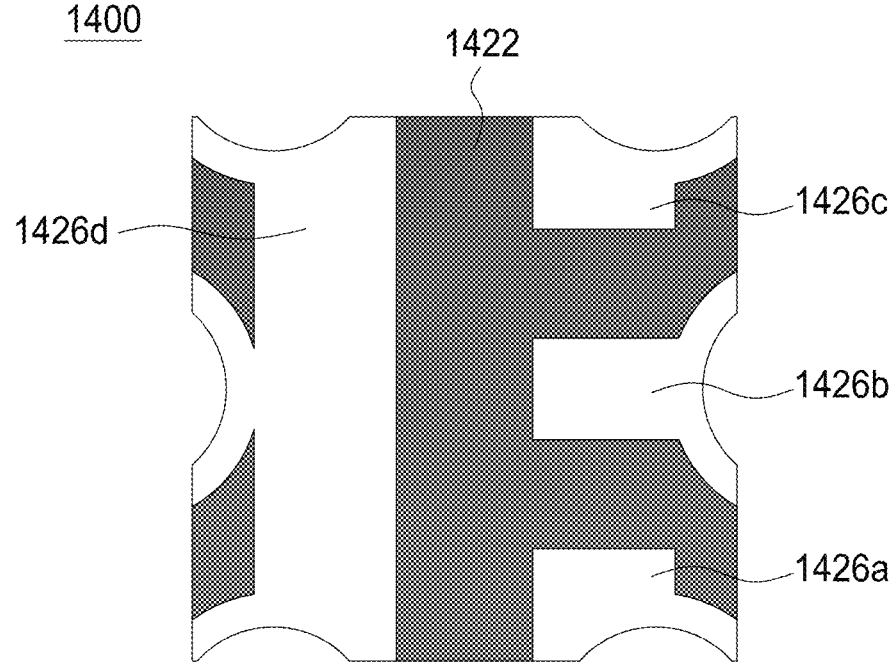
FIG. 14C shows a bottom view of the light-emitting device disclosed in FIG. 14A.

FIG. 14A shows a three-dimensional figure of a light-emitting device 1400 in accordance with one embodiment of present application, FIG. 14B shows a top view of the light-emitting device 1400 disclosed in FIG. 14A, and FIG. 14C shows a bottom view of the light-emitting device 1400 disclosed in FIG. 14A. The light-emitting device 1400 includes a carrier 1420, a light-emitting element 1440, a connecting structure 1460, and a transparent unit 1480. The structures, functions and the manufacturing method of the carrier 1420, the light-emitting element 1440, the connecting structure 1460 and the transparent unit 1480 can be referred to the related paragraphs of the light-emitting device 100.

The difference between the light-emitting device 1400 and the light-emitting device 100 is that the structure of the carrier 1420 and the arrangement of the light-emitting units 1442, 1444, 1446 of the light-emitting element 1440. In one embodiment, the carrier 1420 includes an insulating layer 1422, an upper conductive layer 1424, a lower conductive layer 1426 and conductive through holes 1428. The details of the patterned structure of the upper conductive layer 1424 can be referred to FIG. 14B. The upper conductive layer 1424 includes six connecting portions (or three pairs of upper pads), and six necking portions (or six conductive traces). The arrangement of the upper pads and the light-emitting element 1440 can be referred to FIG. 12B and the related paragraphs. The difference between the upper conductive layer 1424 and the upper conductive layer 1224 disclosed in FIG. 12B is that the upper conductive layer 1424 includes at least four conductive through holes 1428 on the sides of the carrier 1420, not in the corners thereof. In other words, the six conductive through holes 1428 are all located on the sides of the carrier 1420.

The patterned structure of the lower conductive layer 1426 can be referred to FIG. 14C. In one embodiment, the lower conductive layer 1426 includes a first lower conductive pad 1426a, a second lower conductive pad 1426b, a third lower conductive pad 1426c, and a fourth lower conductive pad 1426d. The materials and functions of the lower conductive pads 1426a, 1426b, 1426c, 1426d can be referred to FIG. 12C and the related paragraphs. The difference between the lower conductive layer 1426 and the lower conductive layer 1226 is that the fourth lower conductive pad 1426d includes a bevel side. In one embodiment, fat least one side length of the light-emitting device 1400 is smaller than 400 μm, a gap between two upper pads of each pair is smaller than 80 μm, and a side length of each short side of the lower conductive pads 1426a, 1426b, 1426c is smaller than 100 μm.

Although the present application has been explained above, it is not the limitation of the range, the sequence in practice, the material in practice, or the method in practice. Any modification or decoration for present application is not detached from the spirit and the range of such.

What is claimed is:

1. A light-emitting device, comprising:
    a carrier comprising a plurality of side surfaces, an insulating layer, an upper conductive layer arranged on the insulating layer, a lower conductive layer arranged under the insulating layer, and a plurality of conductive through holes arranged between and connected to the upper conductive layer and the lower conductive layer;
    a plurality of light-emitting units arranged on and electrically connected to the upper conductive layer; and
    a transparent unit fully covering the plurality of light-emitting units, and exposing the lower conductive layer;
    wherein each conductive through hole is exposed from and sandwiched by two adjacent ones of the plurality of side surfaces.

2. The light-emitting device according to claim 1, wherein the plurality of conductive through holes is located at corners of the insulating layer.

3. The light-emitting device according to claim 1, wherein the insulating layer and the transparent unit have two or more surfaces parallel to each other.

4. The light-emitting device according to claim 1, wherein the transparent unit is arranged to laterally cover the plurality of conductive through holes.

5. The light-emitting device according to claim 1, wherein the plurality of light-emitting units is configured to emit blue light, red light, and green light.

6. The light-emitting device according to claim 1, wherein the plurality of light-emitting units is configured to emit a single light.

7. The light-emitting device according to claim 1, further comprising a wavelength conversion material covering one of the plurality of light-emitting units.

8. The light-emitting device according to claim 1, further comprising a connecting structure between the plurality of light-emitting units and the upper conductive layer, wherein the connecting structure comprises an electrical connecting portion and a protection portion surrounding the electrical connecting portions.

9. The light-emitting device according to claim 1, wherein the plurality of light-emitting units and the plurality of conductive through holes are not overlapped with each other in a top view.

10. The light-emitting device according to claim 1, wherein the plurality of light-emitting units is arranged in a straight line.

11. The light-emitting device according to claim 1, wherein the upper conductive layer and the lower conductive layer are solely connected to each other by the plurality of conductive through holes.

12. The light-emitting device according to claim 1, wherein the lower conductive layer comprises a first pad, a second pad, a third pad, and a fourth pad which has a shape different from the first pad.

13. The light-emitting device according to claim 12, wherein the first pad has an area larger than any of the plurality of light-emitting units in a bottom view.

14. The light-emitting device according to claim 1, wherein the upper conductive layer comprises a plurality of separate parts which has more quantity than the plurality of light-emitting units.

15. The light-emitting device according to claim 1, wherein the carrier further comprises a light-absorbing layer arranged on a surface thereof.

16. The light-emitting device according to claim 1, wherein the transparent unit comprises resin, ceramic, glass or the combination thereof.

17. The light-emitting device according to claim 1, wherein each of the plurality of light-emitting units has a shape of rectangle in a top view.

18. The light-emitting device according to claim 1, wherein the plurality of light-emitting units is configured to emit blue light or UV light.

* * * * *